United States Patent
He et al.

(10) Patent No.: US 10,920,328 B2
(45) Date of Patent: Feb. 16, 2021

(54) PHOTOELECTROCHEMICAL CELL

(71) Applicant: King Abdullah University of Science and Technology, Thuwal (SA)

(72) Inventors: Jr-Hau He, Thuwal (SA); Hui-Chun Fu, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 62 days.

(21) Appl. No.: 16/345,970

(22) PCT Filed: Nov. 14, 2017

(86) PCT No.: PCT/IB2017/057113
§ 371 (c)(1),
(2) Date: Apr. 29, 2019

(87) PCT Pub. No.: WO2018/087739
PCT Pub. Date: May 17, 2018

(65) Prior Publication Data
US 2020/0056289 A1    Feb. 20, 2020

Related U.S. Application Data

(60) Provisional application No. 62/421,848, filed on Nov. 14, 2016.

(51) Int. Cl.
C25B 1/00       (2021.01)
C25B 1/55       (2021.01)
B01J 35/00      (2006.01)

(52) U.S. Cl.
CPC ............... *C25B 1/55* (2021.01); *B01J 35/004* (2013.01); *Y02E 60/36* (2013.01); *Y02P 20/133* (2015.11)

(58) Field of Classification Search
None
See application file for complete search history.

(56) References Cited

U.S. PATENT DOCUMENTS

| | | | | |
|---|---|---|---|---|
| 4,521,800 A | * | 6/1985 | Howe | H01G 9/20 257/755 |
| 2013/0157409 A1 | * | 6/2013 | Vaidya | H01L 31/18 438/98 |
| 2015/0083605 A1 | * | 3/2015 | Tamura | B01J 21/063 205/340 |
| 2015/0357498 A1 | * | 12/2015 | Yang | H02S 40/22 136/246 |

OTHER PUBLICATIONS

Fu et al, Improved performance and stability of photoelectrochemical water-splitting Si system using a bifacial design to decouple light harvesting and electrocatalysis, Nano Energy, vol. 70, Jan. 2020, No. 104478 (Year: 2020).*

(Continued)

*Primary Examiner* — Harry D Wilkins, III
(74) *Attorney, Agent, or Firm* — Billion & Armitage

(57) ABSTRACT

Embodiments of the present disclosure describe a photoelectrochemical (PEC) cell comprising a semiconductor photoelectrode configured with at least two light-harvesting faces; a catalyst layer deposited on at least one light-harvesting face and in contact with an electrolyte; a reference electrode deposited on at least another light-harvesting face; and a counter electrode in contact with the electrolyte.

17 Claims, 14 Drawing Sheets

(56) References Cited

OTHER PUBLICATIONS

Hisatomi et al, Recent advances in semiconductors for photocatalytic and photoelectrochemical water splitting, Chemical Society Reviews, Issue vol. 43, No. 22, Jan. 2014, pp. 7520-7535 (Year: 2014).*
Fan et al, n-type silicon photocathodes with Al-doped rear p+ emitter and Al2O3-coated front surface for efficient and stable H2 production, Applied Physics Letters, vol. 106, No. 21, May 2015, No. 213901 (Year: 2015).*
Notification of Transmittal of the International Search Report and the Written Opinion of the International Searching Authority, or the Declaration for PCT/IB2017/057113dated Jan. 15, 2018.
Bae, et al., "Back-illuminated Si photocathode: a combined experimental and theoretical study for photocatalytic hydrogen evolution", Energy & Environmental Science, vol. 8, No. 2,, Dec. 12, 2014, 650-660.
Feckl, et al., "Ultrasmall Co3O4 Nanocrystals Strongly Enhance solar Water Splitting on Mesoporous Hematite", Advanced Materials Interfaces, vol. 2, No. 18, Sep. 2, 2015, 1500358.
Mohapatra, et al., "Double-side illuminated titania nanotubes for high volume hydrogen generation by water splitting", Nanotechnology, vol. 18, No. 4, Nov. 7, 2007, 1-6.
Caban-Acevedo, et al., "Efficient Hydrogen Evolution Catalysis Using Ternary Pyrite-Type Cobalt Phosphosulphide", Nature Materials, vol. 14, Dec. 2015, pp. 1245-1251.
Chen, et al., "Atomic Layer-Deposited Tunnel Oxide Stabilizes Silicon Photoanodes for Water Oxidation", Nature Materials, vol. 10, Jul. 2011, pp. 539-544.
Ding, et al., "Designing Efficient Solar-Driven Hydrogen Evolution Photocathodes Using Semitransparent MoQxCly (Q=S,Se) Catalysts on Si Micropyramids", Advanced Materials, vol. 27, 2015, pp. 6511-6518.
Du, et al. "Catalysts Made of Earth-Abundant Elements (Co, Ni, Fe) for Water Splitting: Recent Progress and Future Challenges", Energy & Environmental Science, vol. 5, 2012, pp. 6012-6021.
Hu, et al., "Amorphous TiO2 Coatings Stabilize Si, GaAs, and GaP Photoanodes for Efficient Water Oxidation", Science, vol. 344, No. 6187, May 30, 2014, pp. 1005-1009.
Ji, et al., "A Silicon-Based Photocathode for Water Reduction With an Epitaxial SrTiO3 Protection Layer and a Nanostructured Catalyst", Nature Nanotechnology, vol. 10, Jan. 2015, pp. 84-90.
Joya, et al., "Water-Splitting Catalysis and Solar Fuel Devices: Artificial Leaves on the Move", Angewandte Chemie International Edition, vol. 52, 2013, pp. 2-14.
Klett, et al., "Electrocatalytic Performance of High-Surface-Area Platinum Catalysts Synthesized by Chemical Vapor Deposition for Water Splitting", ChemCatChem, vol. 8, 2016, pp. 345-351.
Licht, et al., "Efficient Solar Water Splitting, Exemplified by RuO2-Catalyzed AlGaAs/Si Photoelectrolysis", Journal of Physical Chemistry B, vol. 104, No. 38, Sep. 1, 2000, pp. 8920-8924.
Lin, et al., "Packaging Glass with a Hierarchically Nanostructured Surface: A Universal Method to Achieve Self-Cleaning Omnidirectional Solar Cells", ACS Nano, vol. 10, Dec. 1, 2015, pp. 549-555.
Maeda, et al., "GaN:ZnO Solid Solution as a Photocatalyst for Visible-Light-Driven Overall Water Splitting", Journal of the American Chemical Society, vol. 127, May 17, 2005, pp. 8286-8287.
McDowell, et al., "The Influence of Structure and Processing on the Behavior of TiO2 Protective Layers for Stabilization of n—Si/TiO2/Ni Photoanodes for Water Oxidation", ACS Applied Materials & Interfaces, vol. 7, Jun. 17, 2015, pp. 15189-15199.
Ni, et al., "A Review and Recent Developments in Photocatalytic Water-Splitting Using Tio2 for Hydrogen Production", Renewable and Sustainable Energy Reviews, vol. 11, 2007, pp. 401-425.
Reece, et al., "Wireless Solar Water Splitting Using Silicon-Based Semiconductors and Earth-Abundant Catalysts", Science, vol. 334, Nov. 4, 2011, pp. 645-648.
Ren, et al., "A Three-Dimensional Hierarchical TiO2 Urchin as a Photoelectrochemical Anode With Omnidirectional Anti-Reflectance Properties", Physical Chemistry Chemical Physics, vol. 16, Sep. 12, 2014, pp. 22953-22957.
Shaner, et al., "Photoelectrochemistry of Core-Shell Tandem Junction N-P+-Si/N—WO3 Microwire Array Photoelectrodes", Energy & Environmental Science, vol. 7, 2014, pp. 779-790.
Sun, et al., "Stable Solar-Driven Oxidation of Water by Semiconducting Photoanodes Protected by Transparent Catalytic Nickel Oxide Films", Proceedings of the National Academy of Sciences, vol. 112, No. 12, Mar. 24, 2015, pp. 3612-3617.
Sun, et al., "Stable Solar-Driven Water Oxidation to O2(g) by Ni-Oxide-Coated Silicon Photoanodes", Journal of Physical Chemistry Letters, vol. 6, Jan. 19, 2015, pp. 592-598.
Tachibana, et al., "Artificial Photosynthesis for Solar Water-Splitting", Nature Photonics, vol. 6, Aug. 2012, pp. 511-518.
Townsend, et al., "Overall Photocatalytic Water Splitting With NiOx—SrTiO3—A Revised Mechanism", Energy & Environmental Science, vol. 5, Aug. 20, 2012, pp. 9543-9550.
Walter, et al., "Solar Water Splitting Cells", Chemical Reviews, vol. 110, No. 11, Nov. 10, 2010, pp. 3446-6473.
Wang, et al., "High-Performance a-Si/c—Si Heterojunction Photoelectrodes for Photoelectrochemical Oxygen and Hydrogen Evolution", Nano Letters, vol. 15, Feb. 9, 2015, pp. 2817-2824.
Wang, et al., "Omnidirectional Enhancement of Photocatalytic Hydrogen Evolution Over Hierarchical "Cauline Leaf" Nanoarchitectures", Applied Catalysis B: Environmental, vol. 186, 2016, pp. 88-96.
Wang, et al., "Toward Efficient and Omnidirectional n-Type Si Solar Cells: Concurrent Improvement in Optical and Electrical Characteristics by Employing Microscale Hierarchical Structures", ACS Nano, vol. 8, No. 3, Feb. 18, 2014, pp. 2959-2969.
Wei, et al., "Above-11%-Efficiency Organic-Inorganic Hybrid Solar Cells with Omnidirectional Harvesting Characteristics by Employing Hierarchical Photon-Trapping Structures", Nano Letters, vol. 13, Jul. 31, 2013, pp. 3658-3663.

* cited by examiner

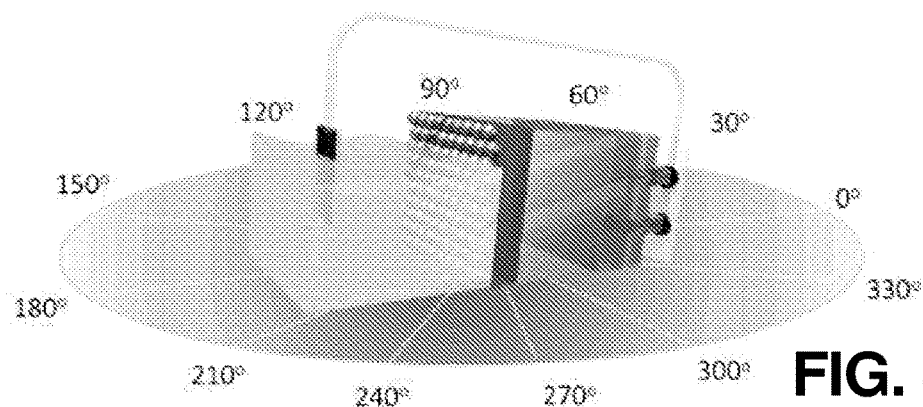
FIG. 4A
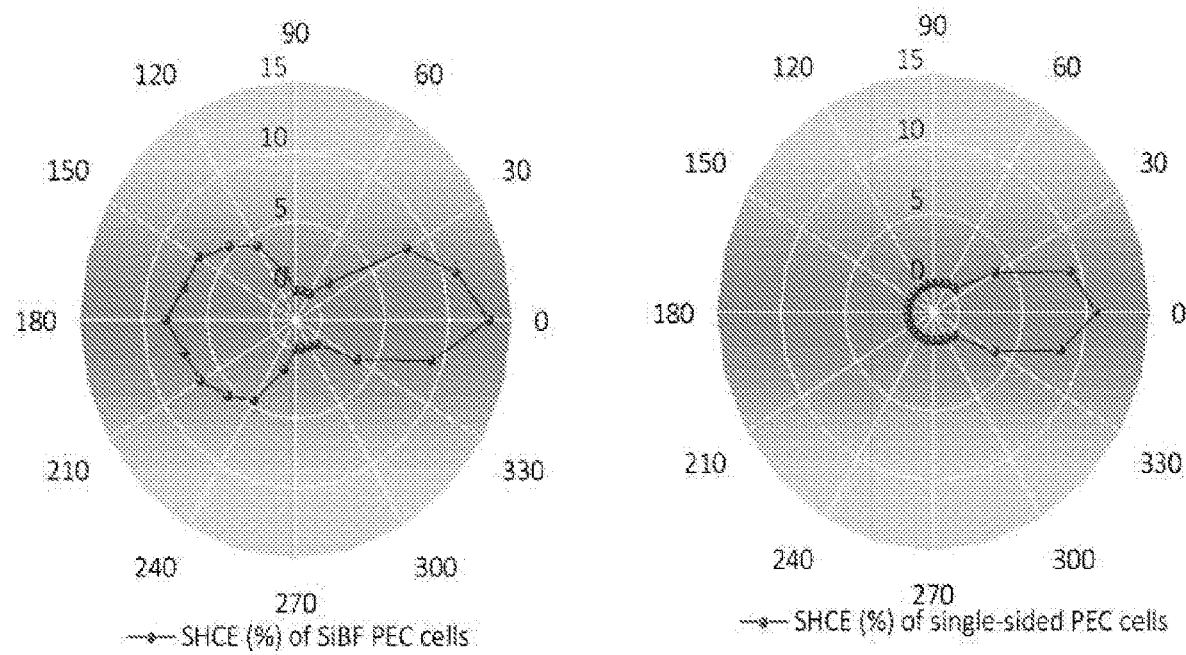
FIG. 4B  FIG. 4C

PHOTOELECTROCHEMICAL CELL

BACKGROUND

Photoelectrochemical (PEC) cells can convert solar energy into chemical energy via water splitting. The prospect of providing a long-term, sustainable, and effective source of renewable energy makes PEC cells a subject of interest, however, the technological advancement of the PEC cells continues to suffer from low performance and complicated engineering and design problems. For instance, current solar-driven water-splitting PEC devices suffer from structural limitations, poor omnidirectional light harvesting properties, short lifetimes and operational stability, chemical corrosion, and low gas production. These problems, among others, have prevented solar-driven water-splitting PEC devices from achieving commercial and industrial success.

Current solar-driven water-splitting PEC devices are constructed as single-sided light-harvesting devices, limiting the omnidirectional light harvesting properties of such devices. In addition, if the PEC cell is configured with the electrolyte/photocathode interface at the light illumination side, the problem becomes more severe due to significant light reflection and/or absorption of the carrier transport and catalyst layers. Current PEC devices also suffer from low gas production due to cell instability in, for example, Si-based devices. Protective layers can be added to reduce chemical corrosion and improve stability and, in some instances, catalytic layers can be used as protective layers to also improve gas evolution activity. However, identifying an appropriate thickness of the protective and/or catalytic layers has been a major impediment to the design of PEC devices, as a layer that is too thick reduces output because significant light is reflected and/or absorbed and a layer that is too thin reduces the performance of the photocatalytic reaction.

The practical application of solar-drive water-splitting PEC devices is thus severely limited because efforts to optimize the gas production rates of these devices fail to balance competing considerations involving light harvesting, chemical protection and stability, and catalytic reaction characteristics.

SUMMARY

In general, embodiments of the present disclosure describe a PEC cell.

Accordingly, embodiments of the present disclosure describe a photoelectrochemical cell comprising a semiconductor photoelectrode configured with at least two light-harvesting faces; a catalyst layer deposited on at least one light-harvesting face and in contact with an electrolyte; a reference electrode deposited on at least another light-harvesting face; and a counter electrode in contact with the electrolyte.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIG. 4(a) illustrates a schematic diagram of PEC measurement at all angles, according to one or more embodiments of the present disclosure.

FIG. 4(b) illustrates a schematic diagram of angular dependent SHCE performance of SiBF cells, according to one or more embodiments of the present disclosure.

FIG. 4(c) illustrates a schematic diagram of angular dependent SHCE performance of conventional single-sided cells, according to one or more embodiments of the present disclosure.

DETAILED DESCRIPTION

Figure 1A:
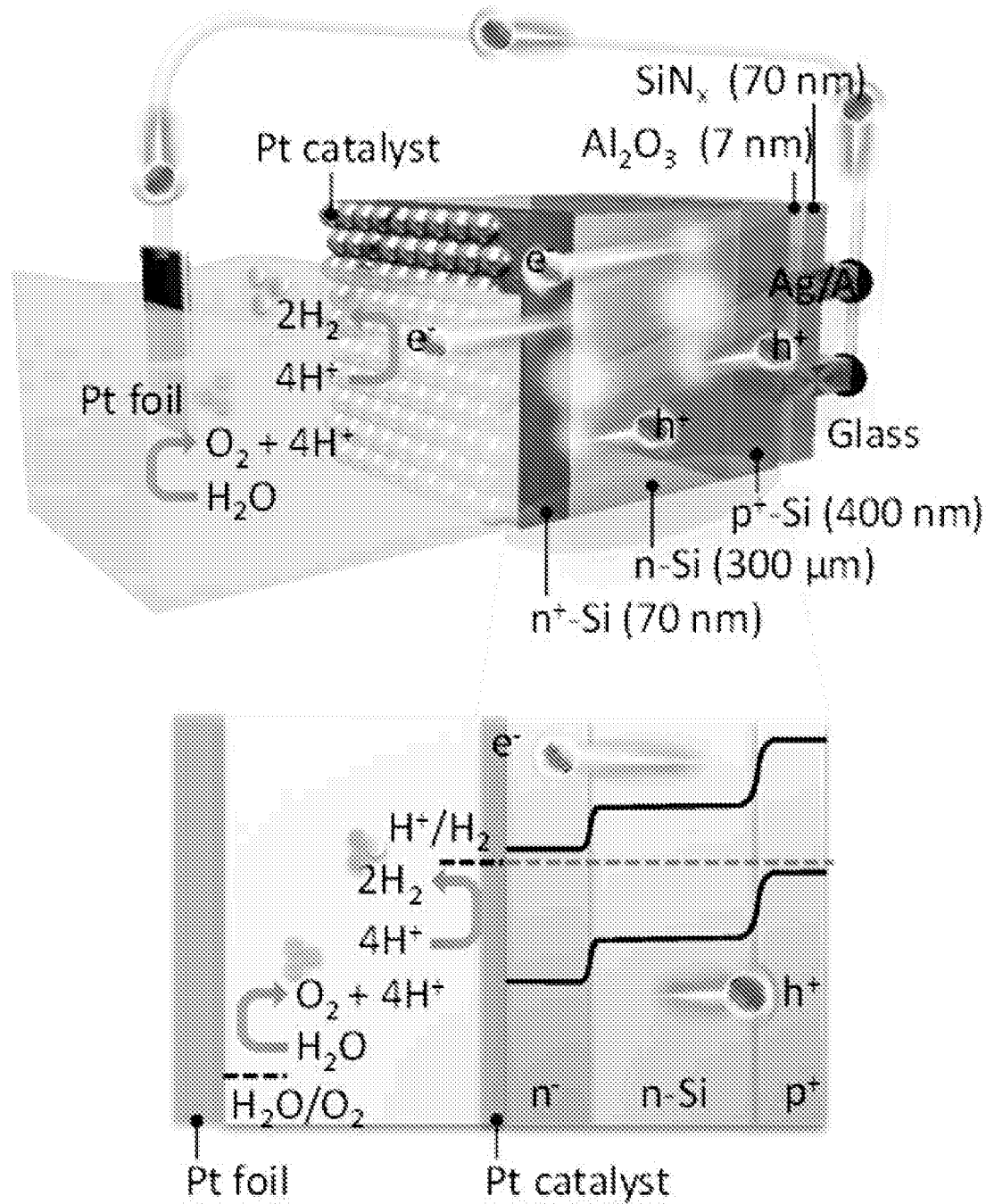
FIG. 1(a) illustrates a schematic diagram and an energy band diagram of an SiBF cell, according to one or more embodiments of the present disclosure.

The invention of the present disclosure relates to PEC cells. The PEC cells of the present disclosure can harvest light from at least two faces to convert solar energy to chemical energy through the production of gas via water splitting. The PEC cells of the present disclosure optimize the combined effect of light harvesting and photocatalytic reaction under bifacial and/or multifacial illumination to achieve a high performing PEC cell. The PEC cells of the present disclosure relate to high performing PEC cells that optimize the omnidirectional light harvesting properties, chemical stability, and photocatalytic activity of the cell to achieve unprecedented gas evolution activity via water splitting. The PEC cells of the present disclosure can exhibit one or more of ultrahigh current density, unprecedented solar to hydrogen conversion efficiency, ultrafast $H_2$ production rate, unprecedented lifetime and operational stability, and ultrahigh omnidirectional light harvesting capability.

An embodiment of the present disclosure describes PEC cells comprising a semiconductor photoelectrode configured with at least two light-harvesting faces, a catalyst layer deposited on at least one light-harvesting face and in contact with an electrolyte, a reference electrode deposited on at least another light-harvesting face, and a counter electrode in contact with the electrolyte. The PEC cells of the present disclosure can further comprise one or more of an antireflection layer, an ohmic contact, and a transparent window. In some embodiments, the at least two light-harvesting faces include a light-harvesting face that forms an interface with the electrolyte and another light-harvesting face that is not in contact with an electrolyte.

The semiconductor photoelectrode is configured with at least two light-harvesting faces. The semiconductor photoelectrode can function as a working electrode. The semiconductor photoelectrode can include one or more semiconductor layers. In some embodiments, the semiconductor photoelectrode includes three semiconductor layers. The semiconductor layers of the semiconductor photoelectrode can include one or more of an n-type semiconductor and a p-type semiconductor. In some embodiments, the n-type semiconductor of the semiconductor photoelectrode can include one or more of an $n^-$-type semiconductor and an $n^+$-type semiconductor. In some embodiments, the p-type semiconductor of the semiconductor photoelectrode can include one or more of a $p^-$-type semiconductor and a $p^+$-type semiconductor. In some embodiments, the semiconductor photoelectrode can include an emitter layer, a back surface layer, and a conductive substrate layer.

In one embodiment, a layer with a light trapping thickness between 100 and 500 μm semiconductor may be utilized, with a large fraction of light being absorbed close to the light-harvesting surface. N-type semiconductor with the thickness of $p^+$-type emitter dopant between 400 nm to 1 μm on top of the cell may function as the negative terminal and the rear of the cell may function as the positive terminal with the thickness of $n^+$-type emitter dopant less than 100 nm.

The semiconductor layers of the semiconductor photoelectrode can include any type of semiconducting material, semiconducting compound, and/or semiconducting element. The semiconductor layers of the semiconductor photoelectrode can be one or more of a Group IV elemental semiconductor, Group IV compound semiconductor, Group VI elemental semiconductor, III-V semiconductor, II-VI semiconductor, I-VII semiconductor, IV-VI semiconductor, IV-VI semiconductor, V-VI semiconductor, II-V semiconductor, $I-III-VI_2$ semiconductor, layered semiconductor, magnetic semiconductor, and charge-transfer semiconductor. The semiconductor layers of the semiconductor photoelectrode can include one or more of a tertiary compound, oxide, and alloy. The semiconductor layers of the semiconductor photoelectrode can include one or more of any element of the periodic table. The semiconductor layers of the semiconductor photoelectrode can include an organic compound. The semiconductor layers of the semiconductor photoelectrode can include one or more of zinc, cadmium, aluminum, gallium, indium, thallium, carbon, silicon, germanium, tin, lead, arsenic, antimony, bismuth, sulfur, selenium, tellurium, and polonium. In some embodiments, the semiconductor layers of the semiconductor photoelectrode can include one or more of silicon, germanium, and gallium arsenide. In other embodiments, the semiconductor layers of the semiconductor photoelectrode may include one or more of CdTe, CIGS, and perovskite.

The catalyst layer is deposited on at least one light-harvesting face and is in contact with an electrolyte. The catalyst layer can function as one or more of a catalyst layer and a protective layer. As a protective layer, the catalyst layer can prevent chemical corrosion of the semiconductor photoelectrode and also serve as a catalyst to enhance gas evolution activity. As a catalyst layer, the catalyst layer can catalyze one or more of the reduction reaction and oxidation reaction at the interface between the electrolyte and the catalyst layer. In some embodiments, the catalyst layer catalyzes the reduction reaction at the interface between the electrolyte and the catalyst layer. One or more of holes and electrons can flow to the catalyst layer. The catalyst layer and/or semiconductor photoelectrode can operate as one or more of a positively charged photoanode, a positively charged photocathode, a negatively charged photoanode, and a negatively charged photocathode.

The catalyst layer can include any material, compound, and/or element known to a person of skill in the art to function as a catalyst. In some embodiments, the catalyst layer includes one or more of Ni, $TiO_2$, $NiO_x$ (where x is equal to or greater than 1), Pt, Ru, Pd, Rh, Fe, and $SrTiO_3$. The electrolyte can include any liquid and/or aqueous solution known to a person of skill in the art to function as an electrolyte. In some embodiments, the electrolyte is water.

The thickness of the catalyst layer is a critical factor in the performance of the PEC cell of the present disclosure. The thickness of the catalyst layer can be tuned to desired performance characteristics, including, but not limited to, a desired current density, solar to hydrogen efficiency, and $H_2$ gas production rate, as well as a desired stability and operating lifetime. As the thickness of the catalyst layer decreases, the current density, solar to hydrogen efficiency, and $H_2$ gas production increases. As the thickness of the catalyst layer increases, the stability and operating lifetime of the PEC cell improves. The thickness of the catalyst layer can range from about 3 nm to about 15 nm. In some embodiments, a 5 nm thick catalyst layer exhibits the highest roughness, with ultrahigh current density, unprecedented solar to hydrogen conversion efficiency, and ultrafast $H_2$ gas production rate. In some embodiments, a 15 nm thick catalyst layer exhibits a uniformly covers the semiconductor photoelectrode, which exhibits ultrahigh stability and long operational lifetimes.

The reference electrode is deposited on at least another light-harvesting face. The reference electrode can include any material, compound, and element know to a person skilled in the art as functioning as a reference electrode. In some embodiments, the reference electrode includes one or more of Ag/AgCl, Hg/HgO, $Hg/Hg_2Cl_2$, and $g/Hg_2SO_4$.

The counter electrode is in contact with the electrolyte. Oxidation and/or reduction can occur at the interface between the counter electrode and the electrolyte. In some embodiments, oxidation occurs at the interface between the counter electrode and the electrolyte. One or more of holes and electrons can flow towards the counter electrode. The counter electrode can operate as one or more of a positively charged anode, a positively charged cathode, a negatively charged anode, and a negatively charged cathode. The counter electrode can include any material, compound, and element known to a person of skill in the art to function as a counter electrode. In some embodiments, the counter electrode is one or more of a platinum foil and a platinum coil.

The PEC cell of the present disclosure can further include an antireflection layer. The antireflection layer can be characterized by the formula $SiN_x$ where x ranges from 1.5 to 1.66. Anti-reflection coatings on silicon substrate consist of a thin layer of dielectric material, with a specifically chosen thickness so that interference effects in the coating cause the wave reflected from the anti-reflection coating top surface to be out of phase with the wave reflected from the semiconductor surfaces. These out-of-phase reflected waves may destructively interfere with one another, resulting in zero net reflected energy. Double layer $SiO_2/TiO_2$ may be utilized as the anti-reflective layer. The thickness may be chosen in order to minimize reflection for a wavelength of 70-90 nm.

The PEC cell of the present disclosure can further include a passivation layer. A high κ dielectric aluminum oxide ($Al_2O_3$) acquires a high negative fixed charge density (Qf) and sufficiently low interface trap density after annealing, enabling excellent surface passivation for crystalline silicon. Low surface recombination velocity (SRV) was obtained by as-deposited $Al_2O_3$ films, which may be associated with the passivation of interface states. The surface may be passivated by reducing the interface trap density (Dit) and controlling the fixed oxide charge (Qf) inside the dielectric.

The PEC cell of the present disclosure can further include a transparent window layer. In some embodiments, the transparent window layer may protect the PEC cell in acidic, neutral, and alkaline solution. In some embodiments, the transparent window layer can include glass (e.g., quartz glass). In one embodiment, the transparent window layer includes about 0.5 mm to about 1 mm of quartz glass.

The PEC cell of the present disclosure can further include an ohmic contact. The ohmic contact may include benefits, such as, high hardness, superior elastic limit, excellent corrosion resistance, and high wear-resistance. The ohmic contact may provide a low-resistance contact at room temperature. In some embodiments, ohmic contact may include one or more of liquid metal. For example, in some embodiments, the ohmic contact may include zirconium-based alloys. For example, in some embodiments, the ohmic contact may include one or more of the following compositions in molar percent: Vitreloy 1 (Zr: 41.2; Be: 22.5; Ti: 13.8; Cu: 12.5; Ni: 10); Vitreloy 4 (Vit4) (Zr: 46.75; Be: 27.5; Ti: 8.25; Cu: 7.5; Ni: 10); Vitreloy 105 (Vit105) (Zr: 52.5; Ti: 5; Cu: 17.9; Ni: 14.6; Al: 10); and a more recent development (Vitreloy 106a), which forms glass under less rapid cooling (Zr: 58.5; Cu: 15.6; Ni: 12.8; Al: 10.3; Nb: 2.8).

An embodiment of the present disclosure includes a Si bifacial PEC cell. The semiconductor photoelectrode of this embodiment includes a first semiconductor layer, a second semiconductor layer, and a third semiconductor layer. The second semiconductor layer and the third semiconductor layer are positioned on opposing sides of and have at least one surface in contact with the first semiconductor layer. The first semiconductor layer can be a n-type Si semiconductor layer with a thickness of about 70 nm, the second semiconductor layer can be a $n^+$-type Si semiconductor layer with a thickness of about 300 μm, and the third semiconductor layer can be a $p^+$-type Si semiconductor layer with a thickness of about 400 nm. The catalyst layer is deposited on an opposing surface of the second semiconductor layer which is the surface not in contact with the first semiconductor layer. The catalyst layer can range from about 3 nm to about 15 nm and can include platinum. An $Al_2O_3$ layer with a thickness of about 7 nm is deposited on an opposing surface of the third semiconductor layer, which is the surface not in contact with the first semiconductor layer. A $Si_2N_3$ layer with a thickness of about 70 nm is deposited on an opposing surface of the $Al_2O_3$ layer, which is the surface not in contact with the third semiconductor layer. The reference electrode is deposited on the surface of the $Si_2N_3$ layer. In this embodiment, the catalyst layer can range from about 3 nm to about 15 nm and can include platinum.

The following Examples are intended to illustrate the above invention and should not be construed as to narrow its scope. One skilled in the art will readily recognize that the Examiners suggest many other ways in which the invention could be practiced. It should be understand that numerous variations and modifications may be made while remaining within the scope of the invention.

Example 1

A Si-Bifacial PEC Cell and a Method of Fabricating a Si-Bifacial PEC Cell

SiBF Cell Fabrication.

Micropyramid silicon arrays were fabricated on both sides of 150-μm-thick n-type (100) Si wafers (dopant concentration of $5 \times 10^{15}$ cm$^{-3}$) by electrodeless chemical etching in a solution of potassium hydroxide (KOH, 45 vol. %) and isopropyl alcohol (IPA). 300 nm of $p^+$ emitter layer (dopant concentration of $9 \times 10^{19}$ cm$^{-3}$) was formed by the thermal diffusion of $BCl_3$. 300 nm of $n^+$ back surface field layer (dopant concentration of $3 \times 10^{20}$ cm$^{-3}$) was fabricated by the thermal diffusion processes of $POCl_4$. 7 nm of $Al_2O_3$ and 50 nm of $Si_3N_4$ were deposited on top of the emitter layer using atomic layer deposition and plasma-enhanced chemical vapor deposition, respectively. The $Al_2O_3$ and $Si_3N_4$ layers were etched with HF after the photolithography process using a patterned mask. Finally, 300 nm of Ag was deposited on top followed by a liftoff process.

SiBF Photoelectrochemical Cell Fabrication.

Various thicknesses of Pt layers were deposited on the Pt-coated side of SiBF cells. Pt layers were deposited using sputtering deposition. Metal wires were attached to the LH side of SiBF cells using Ag paste. Samples were then embedded in Epoxy (Hysol 11C) with only the part covered by Pt exposed to the electrolyte. Epoxy was dried overnight before measurement. Sample areas were then measured through the digital images using Photoshop before further measurements.

PEC Measurements.

PEC characteristics of SHJ photoelectrodes were measured using a potentiostat (Metrohm Autolab). AM 1.5 G illumination was achieved with a 150 W halogen-lamp-based solar simulator using an AM 1.5 G filter. A Hg/HgO in base solution or a Ag/AgCl in neutral and acidic solution and a Pt coil were used as a reference electrode and a counter electrode, respectively. The reference electrode was placed very close to the working electrode surface to minimize any uncompensated solution resistance loss and the distance between reference electrode and working electrode was fixed between measurements. The electrolyte was mechanically agitated and purged with $N_2$ gas before and during measurement. Data collection was conducted using NOVA 2.0 software from Autolab. All the reported potentials are converted to the RHE unless specified.

Various thicknesses of catalytic layers on Si bifacial (SiBF) PEC cells were investigated to characterize the bifacial light harvesting properties, chemical protection capabilities, and catalytic activity of the SiBF. A device with 5 nm of Pt catalytic layer exhibited the highest roughness, giving rise to ultrahigh current density of 61.2 mA/cm$^2$ and solar to hydrogen conversion efficiency (SHCE) of 18.22% with ultrafast $H_2$ production rate of 167 μg in 20 min. By increasing the Pt thickness to 15 nm, the Si surface was uniformly covered with Pt film to achieve chemical protection, leading to ultrahigh stability and can be operated up to 370 hr. Moreover, the cell exhibited significantly higher omnidirectional light harvesting capability at all angles as compared with conventional single-sided devices. Accordingly, due to the extraordinary bifacial cell design and optimized catalyst thickness, the trade-off among light harvesting, catalytic reaction, and chemical protection can be balanced systematically.

Figure 1B:
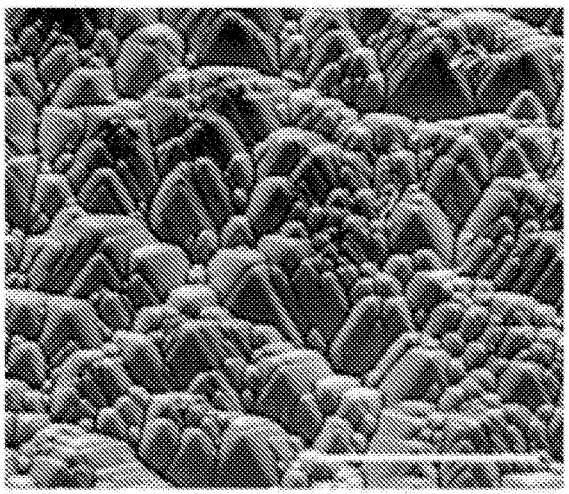
FIG. 1(b) illustrates a SEM image of the LH side of the SiBF cell (scale bars, 10 μm), according to one or more embodiments of the present disclosure.
Figure 1C:
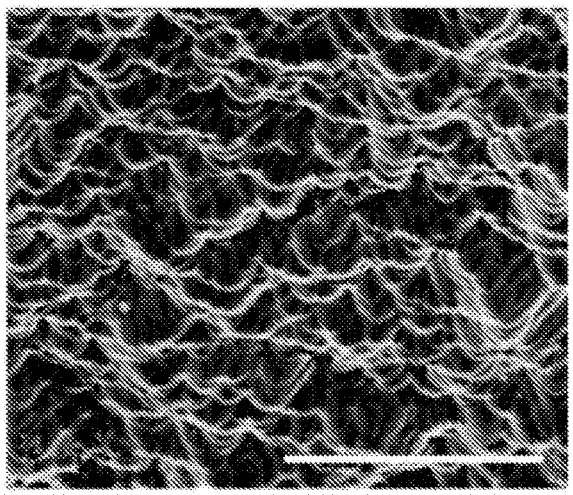
FIG. 1(c) illustrates a SEM image of the Pt-coated side of the SiBF cell (scale bars, 10 μm), according to one or more embodiments of the present disclosure.
Figure 1D:
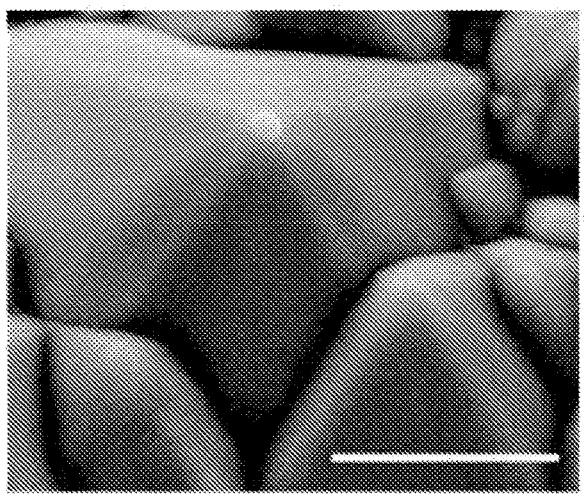
FIG. 1(d) illustrates an enlarged SEM image of the micropyramidal surfaces obtained from the LH side of the SiBF cell (scale bars, 10 μm), according to one or more embodiments of the present disclosure.
Figure 1E:
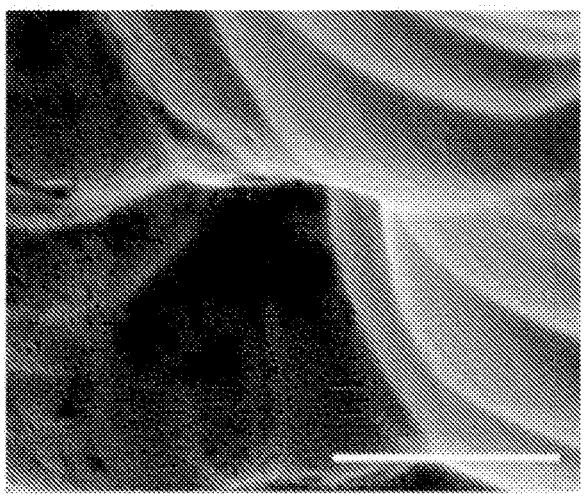
FIG. 1(e) illustrates an enlarged SEM image of the micropyramidal surfaces obtained from the Pt-coated side of the SiBF cell (scale bars, 10 μm), according to one or more embodiments of the present disclosure.
Figure 1F:
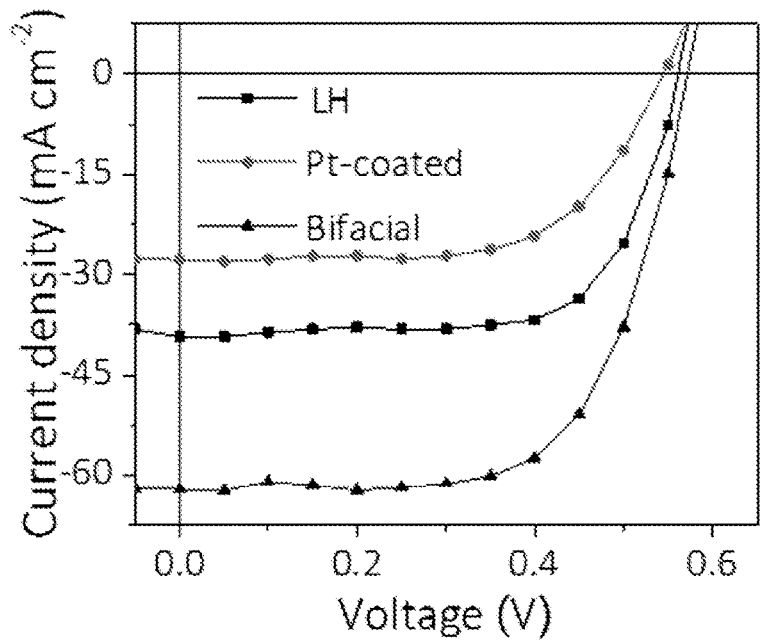
FIG. 1(f) illustrates a graphical view of J-V characteristics of an SiBF cell illuminated from the LH and Pt-coated sides, as well as both sides, according to one or more embodiments of the present disclosure.
Figure 6A:
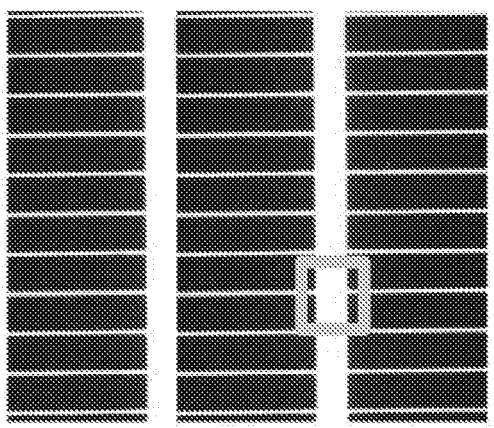
FIG. 6(a) illustrates a photograph of a surface structure of a SiBF PEC device, according to one or more embodiments of the present disclosure.
Figure 6B:
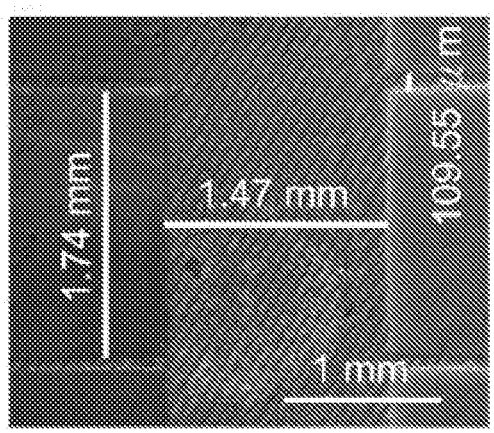
FIG. 6(b) illustrates an enlarged photograph of a surface structure of a SiBF PEC device, according to one or more embodiments of the present disclosure.
Figure 6C:
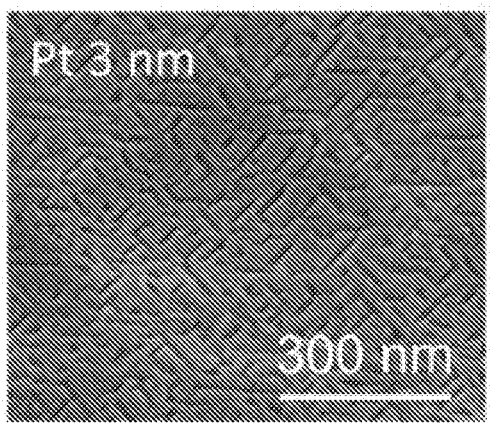
FIG. 6(c) illustrates a SEM image of the SiBF PEC device from the Pt-coated side with 3 nm of Pt catalytic film, according to one or more embodiments of the present disclosure.
Figure 6D:
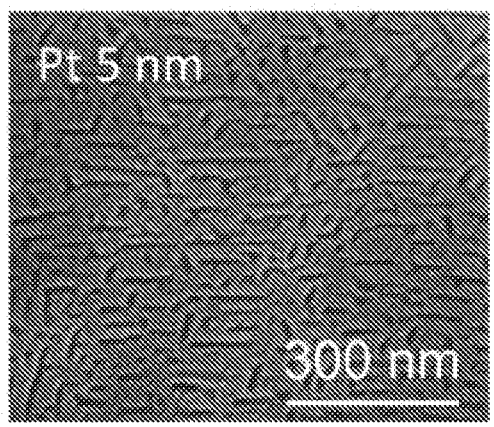
FIG. 6(d) illustrates a SEM image of the SiBF PEC device from the Pt-coated side with 5 nm of Pt catalytic film, according to one or more embodiments of the present disclosure.
Figure 6E:
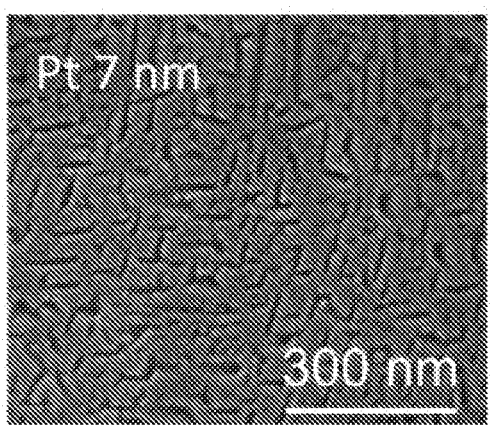
FIG. 6(e) illustrates a SEM image of the SiBF PEC device from the Pt-coated side with 7 nm of Pt catalytic film, according to one or more embodiments of the present disclosure.
Figure 6F:
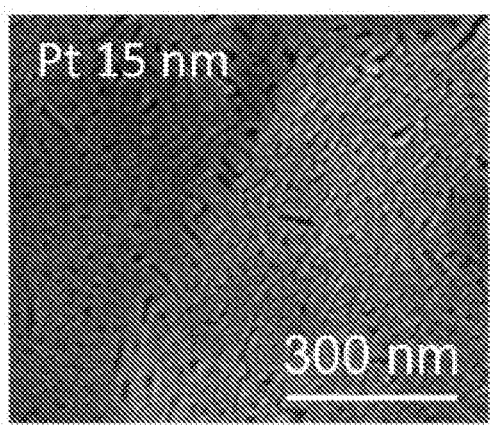
FIG. 6(f) illustrates a SEM image of the SiBF PEC device from the Pt-coated side with 15 nm of Pt catalytic film, according to one or more embodiments of the present disclosure.
Figure 7A:
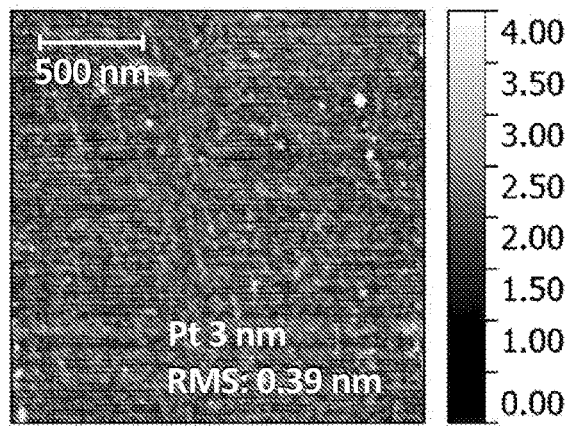
FIG. 7(a) illustrates a surface height profile of Pt catalytic films via AFM mappings of the SiBF PEC device with 3 nm of Pt catalytic film, according to one or more embodiments of the present disclosure.
Figure 7B:
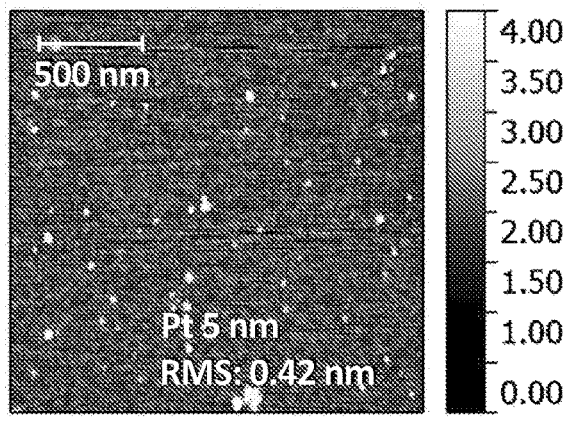
FIG. 7(b) illustrates a surface height profile of Pt catalytic films via AFM mappings of the SiBF PEC device with 5 nm of Pt catalytic film, according to one or more embodiments of the present disclosure.
Figure 7C:
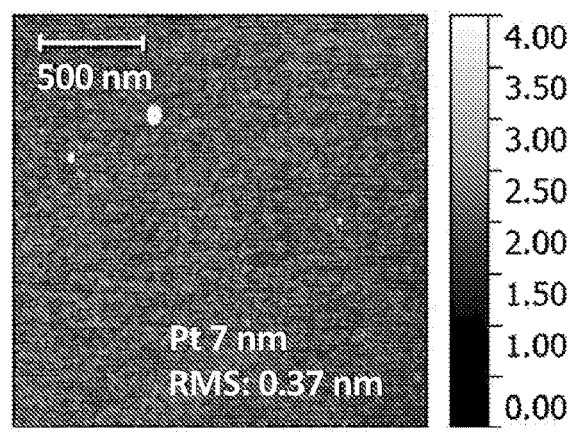
FIG. 7(c) illustrates a surface height profile of Pt catalytic films via AFM mappings of the SiBF PEC device with 7 nm of Pt catalytic film, according to one or more embodiments of the present disclosure.
Figure 7D:
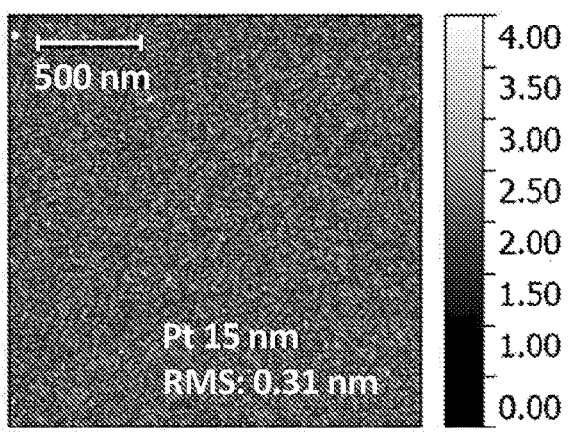
FIG. 7(d) illustrates a surface height profile of Pt catalytic films via AFM mappings of the SiBF PEC device with 15 nm of Pt catalytic film, according to one or more embodiments of the present disclosure.
Figure 8A:
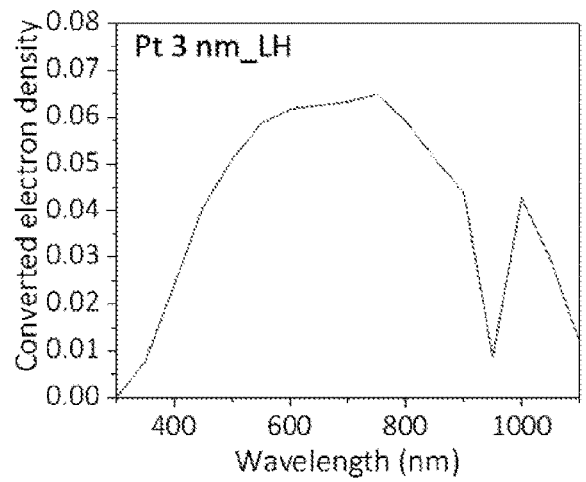
FIG. 8(a) illustrates converted electron density for $J_H$ calculation of the SiBF photoelectrode with 3 nm of Pt illuminated from the light-harvesting side.
Figure 8B:
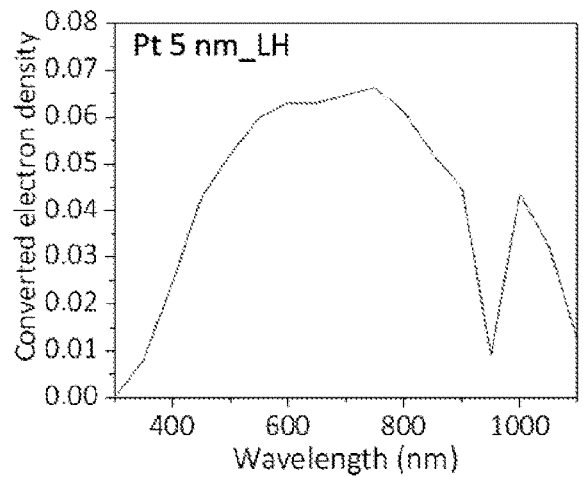
FIG. 8(b) illustrates converted electron density for $J_H$ calculation of the SiBF photoelectrode with 5 nm of Pt illuminated from the light-harvesting side.
Figure 8C:
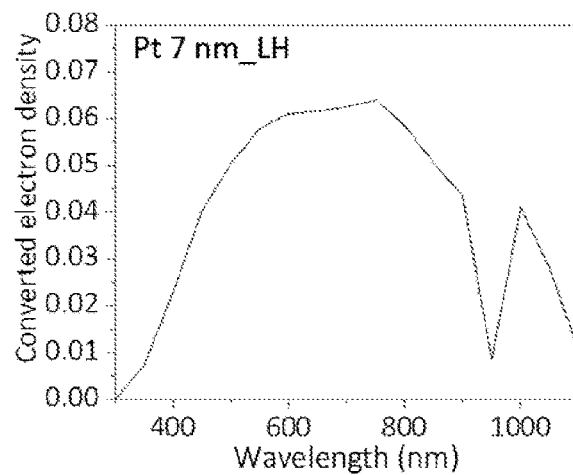
FIG. 8(c) illustrates converted electron density for $J_H$ calculation of the SiBF photoelectrode with 7 nm of Pt illuminated from the light-harvesting side.
Figure 8D:
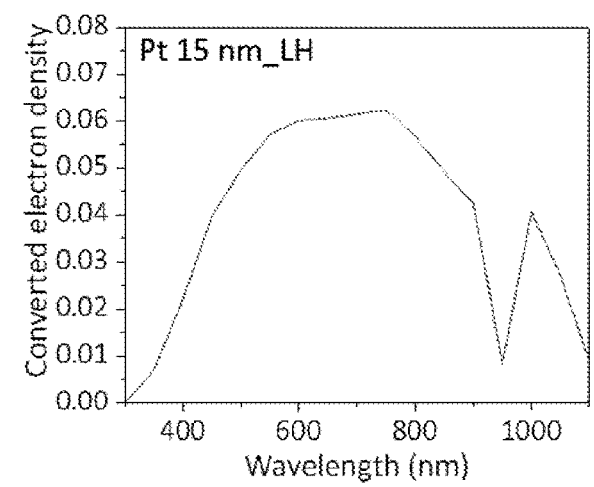
FIG. 8(d) illustrates converted electron density for $J_H$ calculation of the SiBF photoelectrode with 15 nm of Pt illuminated from the light-harvesting side.
Figure 8E:
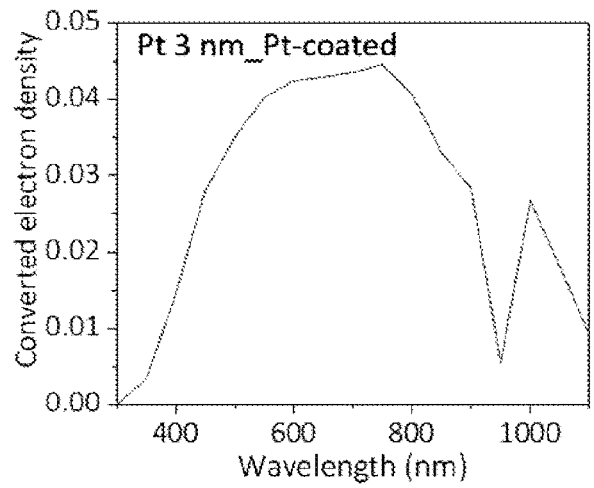
FIG. 8(e) illustrates converted electron density for $J_H$ calculation of the SiBF photoelectrode with 3 nm of Pt illuminated from the Pt-coated side, according to one or more embodiments of the present disclosure.
Figure 8F:
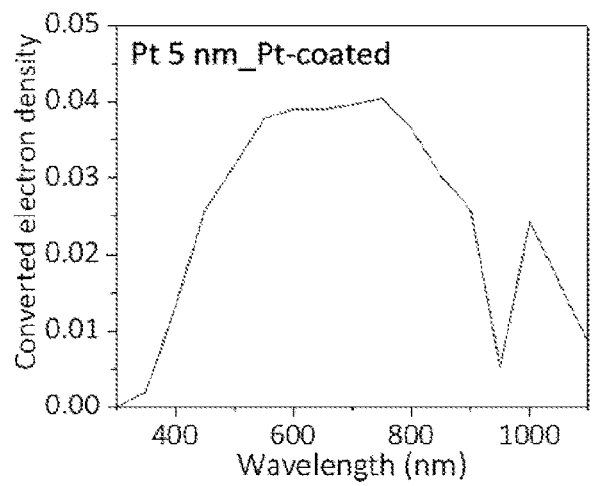
FIG. 8(f) illustrates converted electron density for $J_H$ calculation of the SiBF photoelectrode with 5 nm of Pt illuminated from the Pt-coated side, according to one or more embodiments of the present disclosure.
Figure 8G:
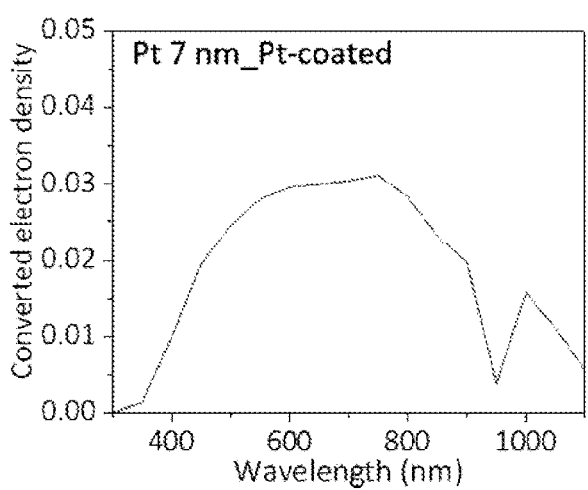
FIG. 8(g) illustrates converted electron density for $J_H$ calculation of the SiBF photoelectrode with 7 nm of Pt illuminated from the Pt-coated side, according to one or more embodiments of the present disclosure.
Figure 8H:
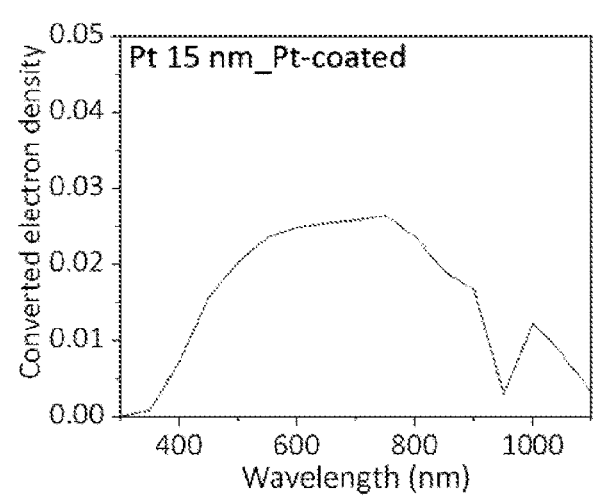
FIG. 8(h) illustrates converted electron density for $J_H$ calculation of the SiBF photoelectrode with 15 nm of Pt illuminated from the Pt-coated side, according to one or more embodiments of the present disclosure.

The schematic and energy band diagram of the SiBF PEC cell are shown in FIG. 1(a). As shown in FIG. 1(a), electrons and holes generated at the interface of p+ and n layers separate toward the Pt-coated side (n+) and light harvesting (LH) (p+) side, respectively, due to the corresponding band alignment. The LH side is especially designed for efficient light harvesting with 50 nm of $Si_3N_4$ antireflection layer. In addition, the electrode on the LH side is finger-patterned with Ag to efficiently collect holes from the emitter layer to the outer circuit, as shown in photographic and enlarged scanning electron microscopy (SEM) images in FIG. 6(a) and FIG. 6(b), respectively. The electrons are received by the hydrogen ions in the electrolyte to generate hydrogen, whereas the holes will arrive at the Pt foil on the other side of the circuit to generate oxygen for charge balance. The surface structures of the LH and Pt-coated sides (before Pt catalyst deposition) are shown in the SEM images in FIG. 1(b) and FIG. 1(c), respectively. FIG. 1(d) and FIG. 1(e) show the enlarged SEM images of FIG. 1(b) and FIG. 1(c), respectively. It is shown that on the Pt-coated side, the micropyramid surface was rounded to reduce recombination at the surface for improving the $H_2$ generation kinetics at the cell/electrolyte interface. To characterize the light harvesting performance of the SiBF cell, photovoltaic J-V curves of the cell illuminated by one sun AM 1.5 G solar irradiation are shown in FIG. 1(f) prior to Pt deposition. To fairly compare photovoltaic properties, the Pt-coated side of the cell was deposited with finger-patterned Ag electrodes similar to the ones on the LH side. The photovoltaic performance of the LH side was better than the performance of the Pt-coated side. This can be attributed to the p-n interface being near the LH surface and $Si_3N_4$ antireflection at the LH side. The SiBF cell was also illuminated bifacially with one sun AM 1.5 G irradiated on both sides. Under bifacial illumination, the short-circuit current density of the cell exceeded 60 mA/cm², giving rise to almost 1.5-fold increase in the power conversion efficiency. After Pt deposition on the Pt-coated side, reflection spectra of the LH side and the Pt-coated side with various Pt thicknesses were measured and shown in FIG. 1(g). The LH side exhibited the highest antireflection ability as compared with all the Pt thicknesses on the Pt-coated side. For thicker layers of Pt, the reflection increased significantly. Moreover, the catalytic reaction at the Pt surface was significantly dependent on the surface area/roughness of the deposited Pt layer. Therefore, to further investigate the surface roughness of the Pt layer with various thicknesses, SEM images of the Pt-coated surfaces with 3 nm, 5 nm, 7 nm, and 15 nm of Pt thicknesses are shown in FIG. 6(c) to FIG. 6(f), respectively. The surface with 5 nm of Pt showed the highest roughness among all surfaces. To quantify the nanoscale roughness of the surfaces, atomic force microscopy (AFM) mapping characterization was also applied to Pt-coated surfaces within 4 µm² area, as shown in FIG. 7(a) to FIG. 7(d). The 5-nm-Pt surface exhibited the highest root-mean-square (rms) of 0.42 nm, which was the highest among all surfaces. This can be attributed to the fact that for sputtering deposition, the uniformity of the deposited layer was dependent on the thickness of the film. For an ultrathin layer such as 3 nm, some of the region may not be covered with Pt, resulting in the flat Si surface exposed. For a thicker layer above 5-nm, a flat Pt film was formed on top, leading to the decrease of surface roughness. Accordingly, the surface with 5 nm of Pt exhibited the highest roughness, which was desired for enhancing the catalytic reaction.

Figure 2A:
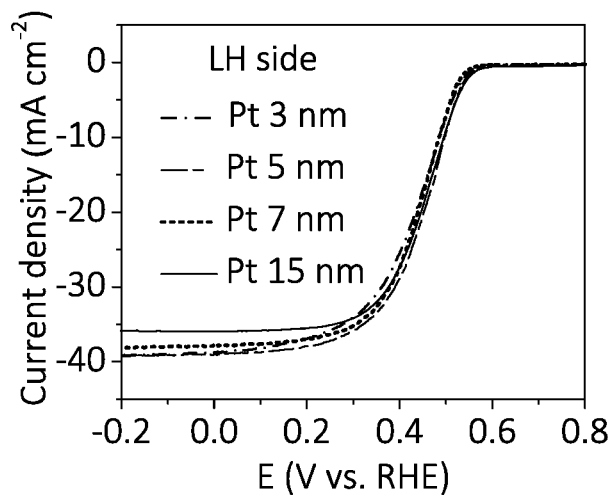
FIG. 2(a) illustrates a graphical view of J-E characteristics of SiBF cells with different thicknesses of Pt illuminated from the LH side, according to one or more embodiments of the present disclosure.
Figure 2B:
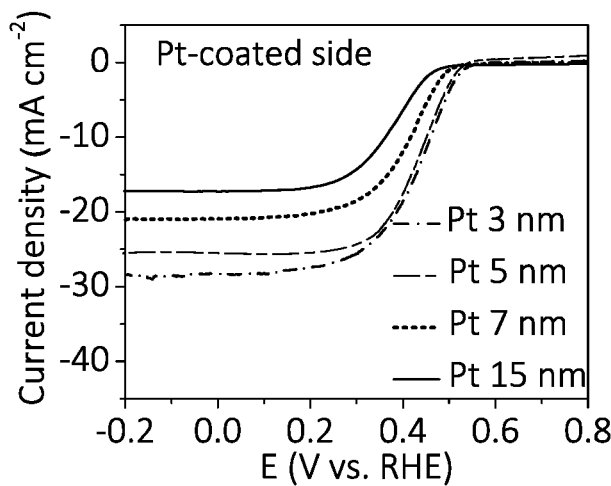
FIG. 2(b) illustrates a graphical view of J-E characteristics of SiBF cells with different thicknesses of Pt illuminated from the Pt-coated side, according to one or more embodiments of the present disclosure.

To investigate the PEC performance of the SiBF devices, a 3-electrode 1-compartment setup was used in the photocathode half-cell measurement consisting of a Pt counter electrode, a Ag/AgCl reference electrode, and a SiBF cell as working electrode in 1 M $H_2SO_4$ for devices. The J-E curves of the devices with various thicknesses illuminated from the LH and Pt-coated sides are shown in FIG. 2(a) and FIG. 2(b), respectively. The relative hydrogen evolution parameters are indicated in Table 1.

TABLE 1

Hydrogen evolution characteristics of SiBF cells with various Pt thicknesses in 1M $H_2SO_4$ electrolyte illuminated with AM 1.5 G on the LH side, Pt-coated side, and bifacially. The onset potential was measured at 1 mA/cm².

| Light absorption surface | Thickness (nm) | $V_{OS} - E^0$ (V) | $J_H$ (mA cm$^{-2}$) | SHCE (%) | FF (%) |
|---|---|---|---|---|---|
| LH | 3 | 0.56 | 36.48 | 11.16 | 53.76 |
|  | 5 | 0.56 | 39.01 | 13.23 | 60.14 |
|  | 7 | 0.56 | 36.24 | 12.27 | 60.05 |
|  | 15 | 0.56 | 35.92 | 11.33 | 55.67 |
| Pt-coated | 3 | 0.54 | 29.69 | 9.37 | 57.81 |
|  | 5 | 0.53 | 25.73 | 8.08 | 58.30 |
|  | 7 | 0.52 | 21.49 | 5.88 | 52.55 |
|  | 15 | 0.47 | 17.24 | 4.29 | 52.90 |
| Bifacial (1 sun/each side) | 5 | 0.57 | 61.20 | 18.22 | 52.24 |

Figure 2C:
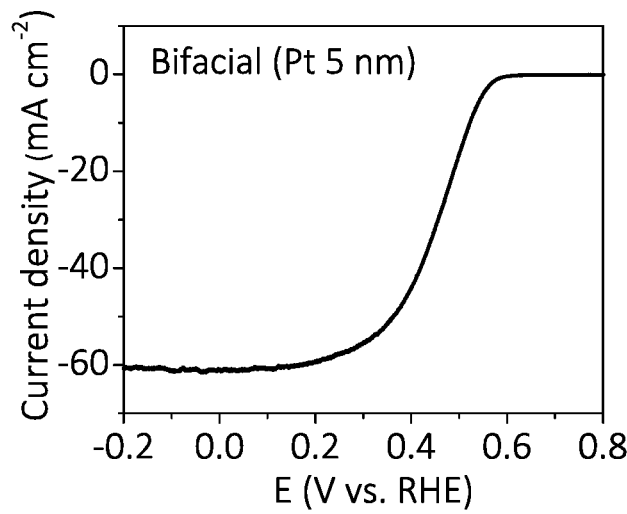
FIG. 2(c) illustrates a graphical view of J-E characteristics of the SiBF cell with 5 nm of Pt illuminated bifacially, according to one or more embodiments of the present disclosure.

The SHCE was calculated as $$SHCE = \frac{|V_{OS} - E^0| \cdot J_H \cdot FF}{I_{ph}} \quad (1)$$

where $V_{OS}$ is the onset potential measured at water reduction current of 1 mA/cm², $E^0$ is the equilibrium water reduction potential, $J_H$ is the current density at $E^0$, FF is the fill factor, and $I_{ph}$ is the incident optical power density. For devices illuminated from the LH side, light harvesting capability was optimized due to the antireflection design. Therefore, the hydrogen evolution performance was mainly determined by the catalytic properties of the Pt catalytic layer. The device with 5 nm of Pt exhibited the highest SHCE of 13.23%, which can be attributed to the excellent catalytic behavior of 5-nm Pt due to highest roughness. For devices illuminated from the Pt-coated side, however, light absorption was significantly dependent on the Pt thickness due to the reflection of Pt layer. Therefore, by increasing the Pt thickness, $V_{OS}$-$E^0$ and $J_H$ decreased abruptly, leading to the gradual decrease of SHCE with increasing Pt thickness. The device with 5-nm Pt showed the highest FF, which can be attributed to the excellent charge transfer of 5-nm Pt catalyst, as discussed in more detail below. FIG. 2(c) shows the J-E curve of the SiBF device with 5-nm Pt illuminated bifacially. Under this condition, the device achieved $J_H$ of 61.2 mA/cm², which was similar to the addition of $J_H$ illuminated from the LH and Pt-coated side, giving rise to a world record high efficiency of 18.22% among Si based photocathodes. In addition, the bifacial design enabled the possibility to balance light trapping, catalytic reaction, and chemical protection in order to achieve excellent performance PEC cells with high stability, as discussed in more detail below.

Figure 2D:
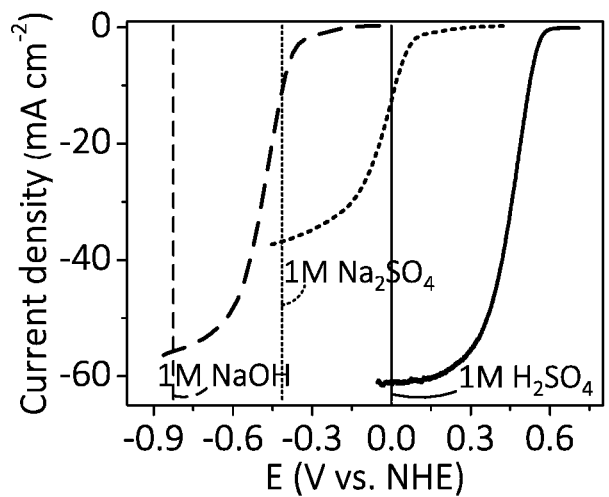
FIG. 2(d) illustrates a graphical view of J-E characteristics of SiBFs with 5-nm Pt in acidic (black line), neutral (red line), and basic (blue line) electrolytes, according to one or more embodiments of the present disclosure.

In order to demonstrate that the SiBF photocathode can work efficiently over a wide range of pH, water reduction by the SiBF photocathode with 5-nm thick Pt was measured under bifacial AM 1.5 G illumination in acidic (1 M $H_2SO_4$), neutral (1 M $Na_2SO_4$), and basic (1 M NaOH) electrolytes, as shown in FIG. 2(d). The photocathode characteristics are summarized in Table 2. In acidic and basic electrolytes, the SiBF device exhibited high current densities of 61.20 mA/cm$^2$ and 48.92 mA/cm$^2$, respectively. This indicated the excellent hydrogen evolution ability of SiBF device over a wide range of pH conditions. Even working in the neutral electrolyte, the device exhibited a current density of 36.73 mA/cm$^2$. Accordingly, the ultrahigh current densities for hydrogen evolution of the present SiBF cells significantly improved the hydrogen evolution rate for efficient PEC water splitting.

TABLE 2

Hydrogen evolution characteristics of SiBF cells with 5-nm Pt as the catalyst in acidic, neutral, and basic electrolytes under bifacial AM 1.5 G illumination. The onset potential was measured at 1 mA/cm$^2$.

|  | $J_H$ (mA cm$^{-2}$) | $V_{OS} - E^0$ (V) | FF (%) | SHCE (%) |
|---|---|---|---|---|
| 1M $H_2SO_4$ | 61.20 | 0.57 | 52.24 | 18.22 |
| 1M $Na_2SO_4$ | 36.73 | 0.55 | 41.08 | 8.30 |
| 1M NaOH | 48.92 | 0.56 | 43.00 | 11.78 |

Figure 2E:
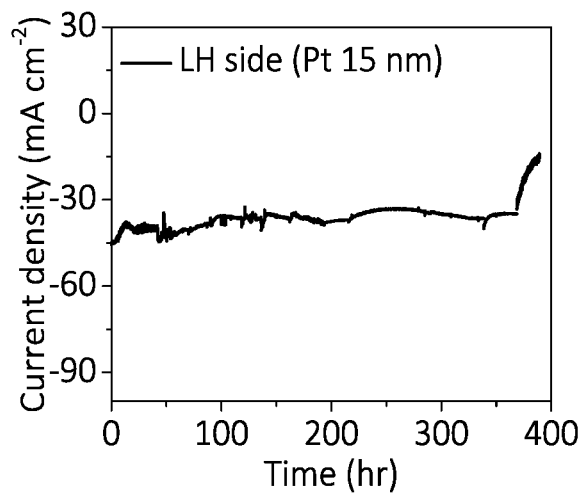
FIG. 2(e) illustrates stability characteristic of the 15-nm Pt coated SiBF cell with an area of 0.25 $cm^2$ illuminated from the LH side, according to one or more embodiments of the present disclosure.
Figure 9A:
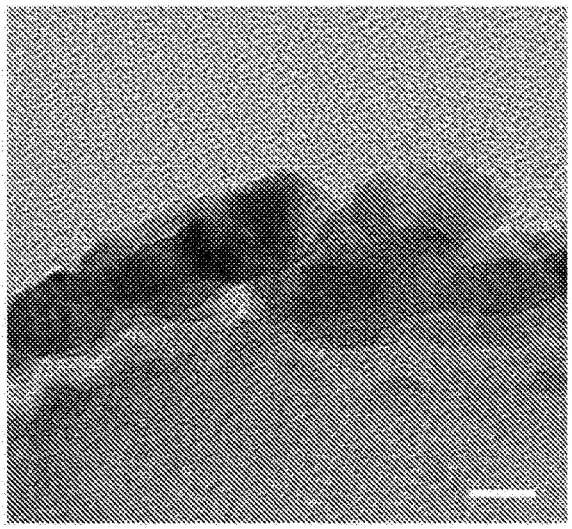
FIG. 9(a) illustrates a TEM image of the 5-nm-Pt/Si interface before the stability measurement (scale bar, 5 nm), according to one or more embodiments of the present disclosure.
Figure 9B:
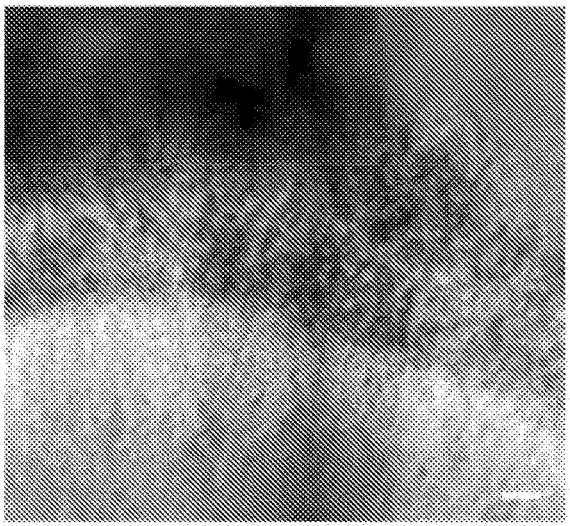
FIG. 9(b) illustrates a TEM image of the 5-nm-Pt/Si interface after the stability measurement (scale bar, 20 nm), according to one or more embodiments of the present disclosure.
Figure 9C:
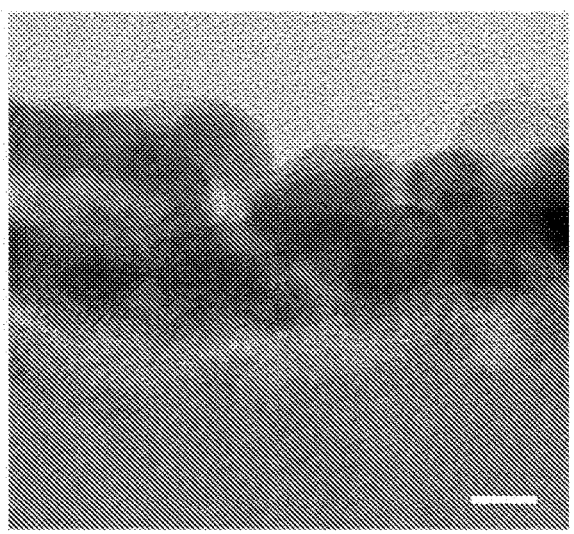
FIG. 9(c) illustrates a TEM image of the 15-nm-Pt—Si interface before the stability measurement (scale bar, 5 nm), according to one or more embodiments of the present disclosure.
Figure 9D:
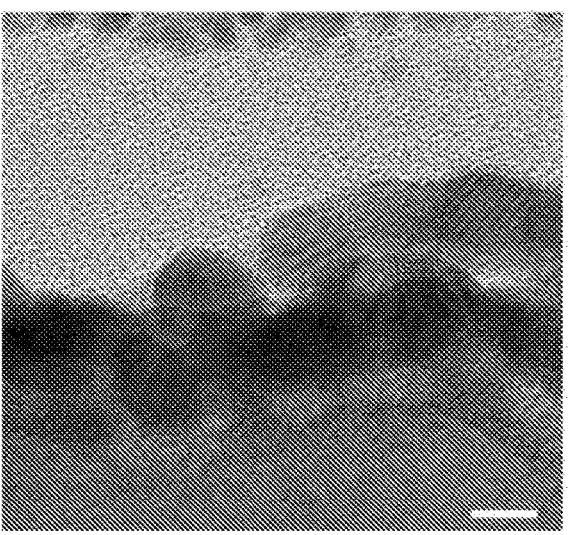
FIG. 9(d) illustrates a TEM image of the 15-nm-Pt—Si interface after the stability measurement (scale bar, 5 nm), according to one or more embodiments of the present disclosure.

In addition to the performance tests in different pH electrolytes, the lifetime of SiBF devices with 15 nm of Pt catalyst in acidic electrolyte was evaluated. FIG. 2(e) shows that the SiBF device remained stable after 370 hr of operation in 1 M acidic electrolyte. This can be attributed to the outstanding protection of compact and fully-covered 15 nm Pt catalytic layer present on top of the Si surface, as mentioned previously and indicated in FIG. 6(f). To further evaluate the chemical corrosion phenomenon of the Pt/Si interface, cross-sectional transmission electron microscopy (TEM) images of the interface with 5 nm and 15 nm of Pt were obtained before and after 10-hr stability test, as shown in FIG. 9. FIG. 9(a) shows that the 5 nm-Pt covered on top of the Si surface was uniform and intact before the stability test. However, after 10 hr of stability test operation, the surface of the photocathode was etched and became needle-like structures. The etched Pt/Si surface became fragile and, upon focus ion beam preparation of the TEM samples, the crystallinity of the surface can be damaged by the ion beam and become amorphous. In contrast, it is shown in FIG. 9(c) and FIG. 9(d) that the 15 nm-Pt covered photocathode remained uniform and intact throughout the 10 hour stability measurement, demonstrating its outstanding chemical stability for long term operation. By sputtering deposition, the roughness of the catalytic layer was higher as compared with other deposition techniques such as atomic layer deposition. High roughness was desired for efficient catalytic behavior with the sacrifice of film uniformity and device stability.

Figure 2F:
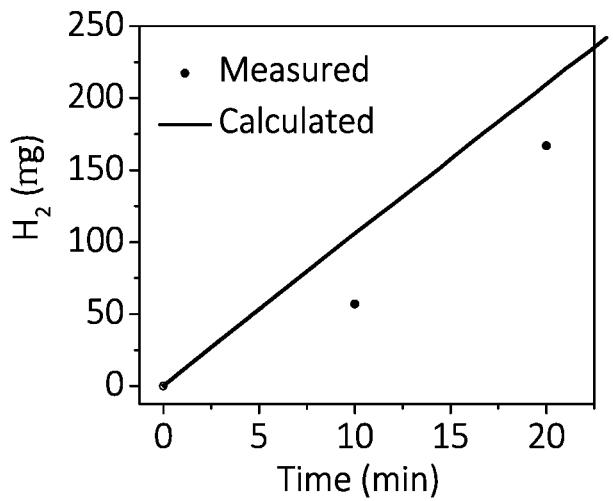
FIG. 2(f) illustrates a graphical view of an amount of hydrogen evolved and calculated under bifacial illumination as a function of time, according to one or more embodiments of the present disclosure.

To characterize the $H_2$ evolved by the SiBF device, the gas was collected by the gas chromatographic (GC) analyzer. FIG. 2(f) shows the amount of $H_2$ evolved and calculated by the initial current density under bifacial illumination. After 20 min of operation time, ~167 μg of $H_2$ was evolved by the SiBF device. The slightly lower $H_2$ evolved as compared with the calculation result can be attributed to the excessive amount of $H_2$ absorbed on the surface of the device, which can be further enhanced by designing a more efficient stirring method.

Figure 3A:
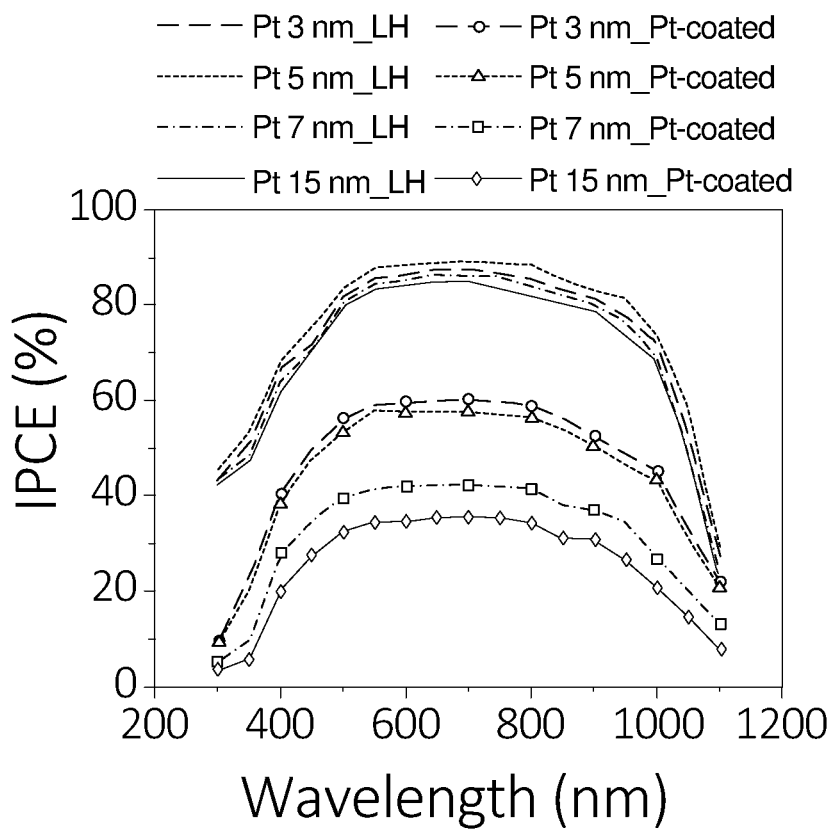
FIG. 3(a) illustrates a graphical view of IPCE spectra of SiBF cells with different thicknesses of Pt illuminated from LH and Pt-coated sides, according to one or more embodiments of the present disclosure.

To further characterize the PEC properties of the SiBF devices, incident-photon-conversion efficiency (IPCE), internal quantum efficiency (IQE), and electrochemical impedance spectroscopy (EIS) measurements were carried out. The IPCE spectra for various Pt thicknesses illuminated from the LH and Pt-coated sides are shown in FIG. 3(a). The IPCE curves were measured at 0 V vs. RHE. The spot size (diameter=0.5 cm) of the monochromated light on the sample surface was smaller than the sample size (~0.5 cm×0.5 cm). The photocurrent ($J_{ph}$) was calculated using the equation below:

$$J_{ph} = \frac{I_{ph} - I_d}{A_{ph}} \quad (2)$$

where $I_d$ is the dark current, $I_{ph}$ is the current measured under light illumination, and $A_{ph}$ is the spot size of the monochromated light. Therefore, IPCE can be expressed as $$IPCE = \frac{1240 \times J_{ph}}{\lambda \times \frac{J_{ph}}{R_\lambda}} = \eta_{ext} \times \frac{J_{ph}}{J_{phD}} \quad (3)$$

where λ is the wavelength of incident light, $J_{phD}$ is the photocurrent from the Si photodetector, $R_\lambda$ is the responsivity of the Si photodetector provided by the supplier and $n_{ext}$ is the external quantum efficiency of the Si photodetector. When illuminated from the LH side, the device with 5-nm Pt exhibited the highest IPCE from 300 nm to 1100 nm. Since the light harvesting capabilities of devices illuminated from the LH for all the thicknesses should be consistent, the high IPCE of the device with 5-nm Pt originated from the superior catalytic performances of 5-nm Pt. When illuminated from the Pt-coated side, however, the light trapping was significantly dependent on the Pt thickness. Therefore, the device with 3-nm Pt showed the highest IPCE throughout the measured wavelength region. The IPCE spectra were adopted to confirm the $J_H$ measured in FIG. 3(a) and FIG. 3(b). FIG. 8 shows the corresponding converted electron density spectra of the device with various Pt thicknesses for $J_H$ calculation. The calculated $J_H$ are summarized in Table S1, showing the consistency of the calculated results with respect to the ones shown in Table 1.

TABLE S1

Converted $J_H$ in the water (mA cm$^{-2}$)

| Light absorption surface | Pt 3 m | Pt 5 m | Pt 7 m | Pt 15 nm |
|---|---|---|---|---|
| LH | 33.75 | 34.68 | 33.13 | 32.48 |
| Pt-coated | 22.60 | 20.56 | 15.46 | 12.72 |

Figure 1G:
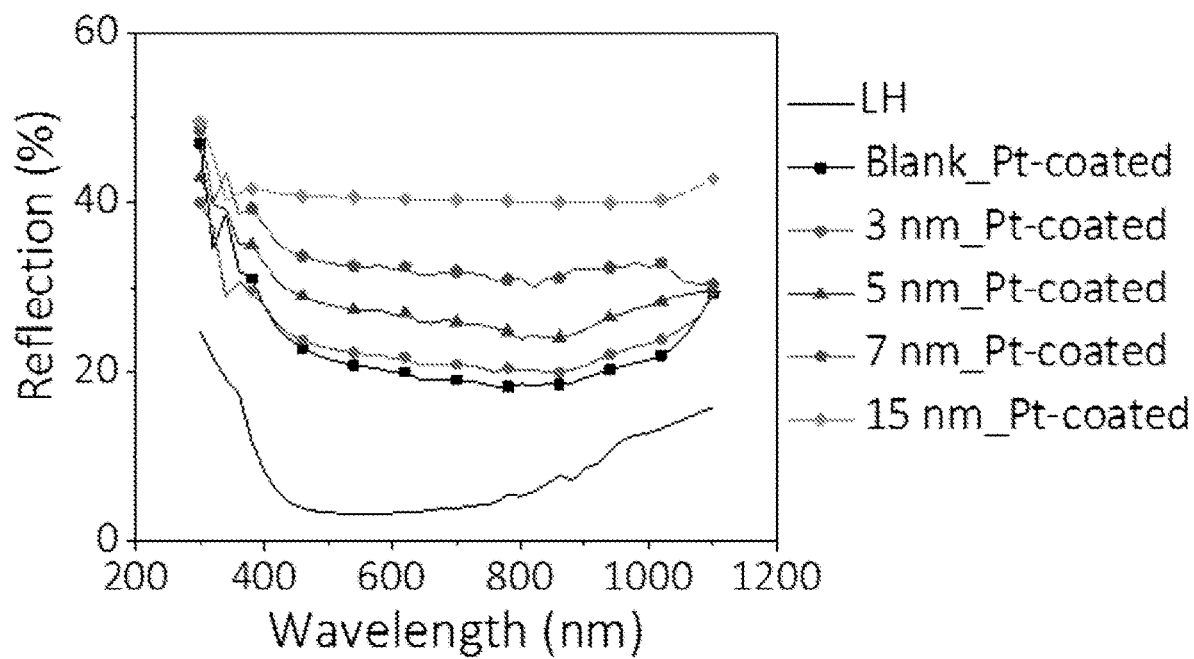
FIG. 1(g) illustrates a graphical view of reflection spectra of the SiBF cell measured form the LH surface and the Pt-coated surfaces with various Pt thicknesses, according to one or more embodiments of the present disclosure.
Figure 3B:
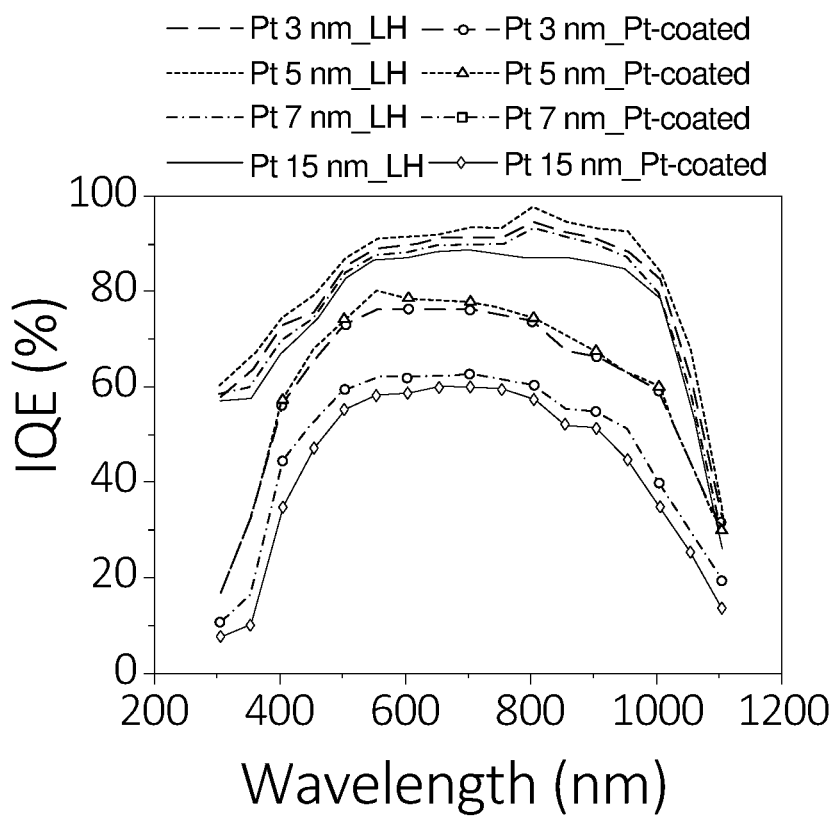
FIG. 3(b) illustrates a graphical view of IQE spectra of SiBF cells with different thicknesses of Pt illuminated from LH and Pt-coated sides, according to one or more embodiments of the present disclosure.
Figure 3C:
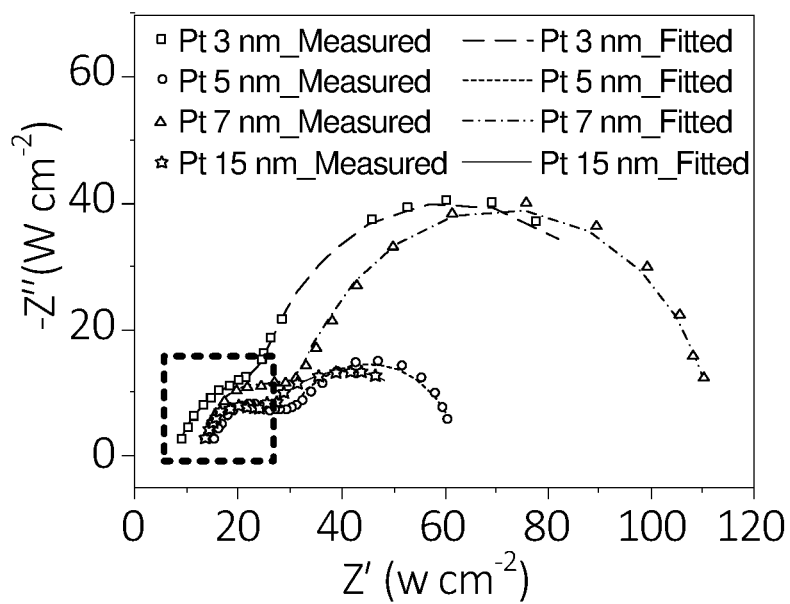
FIG. 3(c) illustrates a graphical view of EIS Nyquist plots for SiBF cells with different thicknesses of Pt illuminated from LH and Pt-coated sides, according to one or more embodiments of the present disclosure.
Figure 3D:
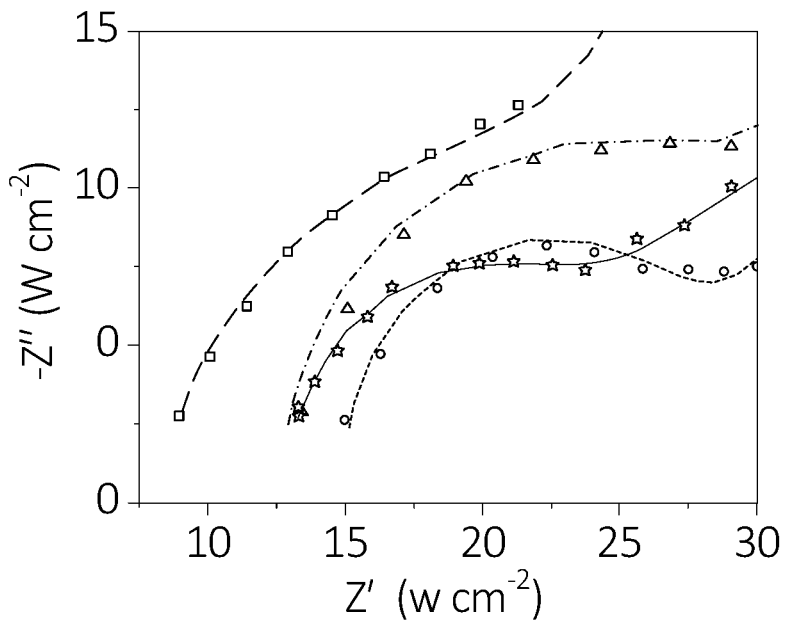
FIG. 3(d) illustrates a graphical view of an enlarged Nyquist plots for SiBF cells with different thicknesses of Pt illuminated from LH and Pt-coated sides, according to one or more embodiments of the present disclosure.
Figure 3E:
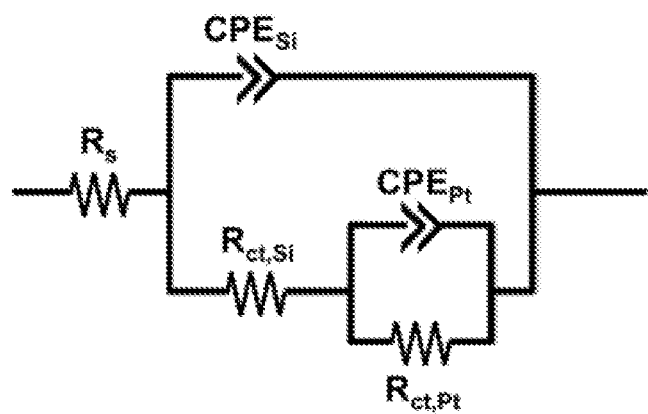
FIG. 3(e) illustrates a schematic diagram of an equivalent circuit model of the SiBF cell, according to one or more embodiments of the present disclosure.

To further confirm the catalytic performance of devices with various thicknesses, IQE spectra were calculated using IPCE and reflection spectra to rule out the light trapping effect. FIG. 3(b) shows the IQE of the devices with various Pt thicknesses illuminated from the LH and Pt-coated sides. The IQE can be expressed as $$IQE = \frac{IPCE}{1 - R} \quad (4)$$

where R is the reflection shown in FIG. 1(g). When illuminated from either the LH or Pt-coated side, the device with 5-nm Pt exhibited the highest IQE among all thicknesses throughout the measured wavelength region. Accordingly, the 5-nm Pt exhibited the highest catalytic performance, which was consistent with the SEM and AFM roughness results discussed above. The enhancement of IQE originated from the enhanced catalytic activity and electrical conduction simultaneously. Therefore, circuit model fitting analysis of the electrochemical impedance spectroscopy (EIS) was performed for devices with various thicknesses, as shown in FIG. 3(c) and FIG. 3(d). As shown in FIG. 3(e), devices can be modeled using a circuit consisting of a series resistance ($R_s$), constant phase element for Si ($CPE_{Si}$), charge transfer resistance for Si ($R_{ct,Si}$), constant phase element for Pt ($CPE_{Pt}$), and charge transfer resistance for Pt ($R_{ct,Pt}$). The corresponding charge transfer resistances and other elements for Si and Pt films are identified in Table 3 and Table S3, respectively. As the thickness of Pt film increases, the conductivity of the Si cell improved. However, the catalytic activity was the highest with 5-nm Pt film. Therefore, the cell with 5-nm Pt exhibited the lowest $R_{ct,Si}$ of 14.0 Ωcm$^2$ and $R_{ct,Pt}$ of 34.1 Ωcm$^2$ for cells with Pt thicknesses range from 3 nm to 7 nm. The cell with 15 nm of Pt exhibited even lower $R_{ct,Si}$ and $R_{ct,Pt}$. However, the catalytic activity was not high enough for efficient hydrogen production.

TABLE 3

Fitted charge transfer resistances for SiBF cells with various thicknesses of Pt catalysts shown in the EIS Nyquist plots (FIG. 3c).

| Photocathode | 3 nm | 5 nm | 7 nm | 15 nm |
|---|---|---|---|---|
| $R_{ct,\,Si}$ (Ω cm$^2$) | 28.2 | 14.0 | 22.3 | 12.6 |
| $R_{ct,\,Pt}$ (Ω cm$^2$) | 65.7 | 34.1 | 77.8 | 34.1 |

TABLE S2

Fitted values of all elements in the equivalent circuit for the Nyquist impedance plots of Pt/SiBF photoelectrodes

| Pt thickness | $R_s$ (Ω cm$^2$) | Q1 (F S$^{\alpha-1}$) | α1 | Q2 (F S$^{\alpha-1}$) | α2 |
|---|---|---|---|---|---|
| 3 nm | 7.98 | 94.3 × 10$^{-9}$ | 0.84 | 4.44 × 10$^{-7}$ | 1.0 |
| 5 nm | 15.1 | 1.0 × 10$^{-6}$ | 1.0 | 1.07 × 10$^{-6}$ | 0.85 |
| 7 nm | 12.6 | 73.2 × 10$^{-9}$ | 1.0 | 7.46 × 10$^{-7}$ | 0.96 |
| 15 nm | 13.2 | 20.3 × 10$^{-8}$ | 1.0 | 2.75 × 10$^{-6}$ | 0.75 |

Figure 5A:
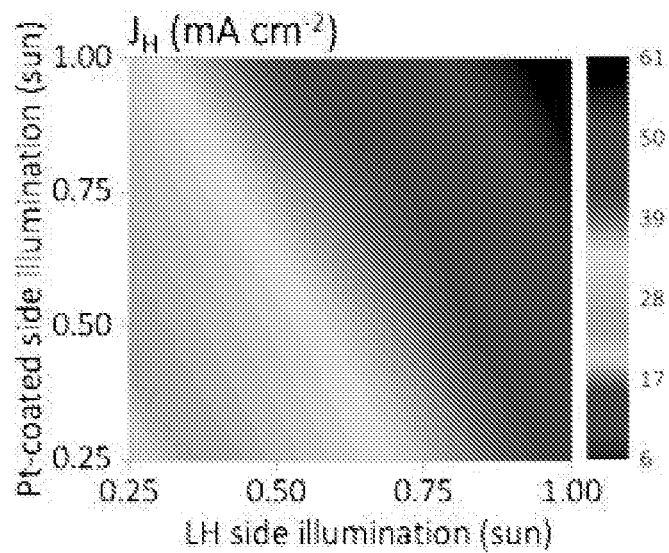
FIG. 5(a) illustrates light-intensity dependent current density of an SiBF cell, according to one or more embodiments of the present disclosure.
Figure 5B:
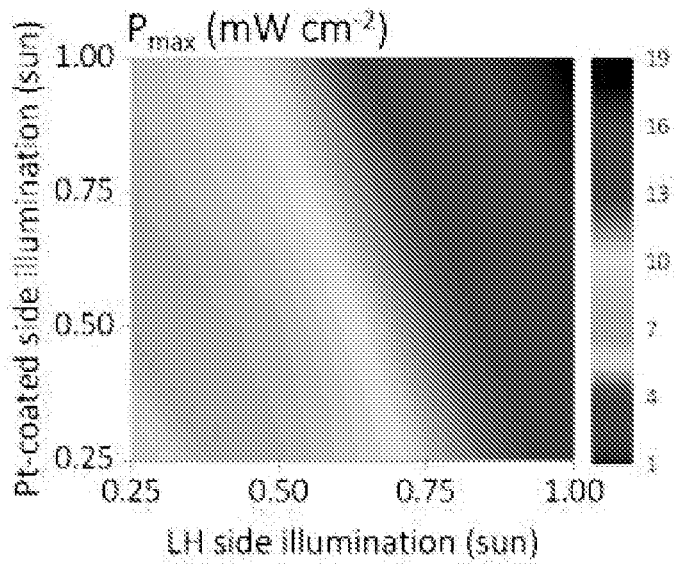
FIG. 5(b) illustrates light-intensity dependent SHCE of an SiBF cell, according to one or more embodiments of the present disclosure.
Figure 5C:
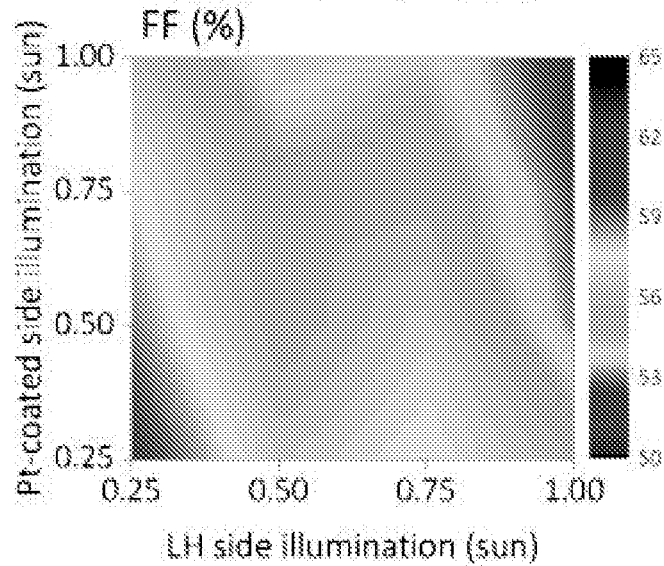
FIG. 5(c) illustrates light-intensity dependent FF of an SiBF cell, according to one or more embodiments of the present disclosure.

In addition to the above-discussed bifacial operation characteristics, angular dependent PEC measurements of SiBF cells and conventional one-sided crystalline Si cells under AM 1.5 G illumination were also performed according the schematic shown in FIG. 4(a). Both kinds of cells were coated with 5 nm of Pt at the hydrogen evolution side. The results for SiBF and conventional one-sided cells at all angles are shown in FIG. 4(b) and FIG. 4(c), respectively. In FIG. 4(b), SHCE results of the SiBF from 0° to 180° and 180° to 360° were obtained with illumination on the LH and Pt-coated sides, respectively. The SiBF in FIG. 4(b) exhibited excellent omnidirectional hydrogen evolution capability. In contrast, the SHCE of the one-sided cell exhibited significant light reflection as illuminated from the Pt-coated side, leading to unsatisfied SHCE. The light-intensity dependent $J_H$, $P_{max}$, and FF of the SiBF cell were performed and shown in FIG. 5(a), FIG. 5(b), and FIG. 5(c), respectively. $P_{max}$ is the maximum hydrogen evolution power density and is defined as $$P_{max} = |V_{OS} - E^0| \cdot J_H \cdot FF \quad (5)$$

The $J_H$ and $P_{max}$ increased faster as the light illumination increased from the LH side, indicating the excellent light trapping behavior. However, as the light intensity increased, more charge carriers were generated in the device, leading to a high level of charge accumulation and recombination near the catalyst/electrolyte interface (FF decreases). The related photovoltaic parameters are summarized in Table 4. For practical application, there were reflection mirror designs for achieving bifacial illumination rather than providing two light sources. Therefore, it was important to characterize the bifacial light-intensity dependent photovoltaic parameters for designing the optimal bifacial PEC systems.

TABLE 4

Hydrogen evolution parameters of different light power density illuminating on the SiBF cell with 5-nm Pt catalyst.

| LH side (sun) | Pt-coated side (sun) | $V_{OS} - E^0$ (V) | $J_H$ (mA cm$^{-2}$) | FF (%) | $P_{max}$ (mW/cm$^2$) |
|---|---|---|---|---|---|
| 1 | 1 | 0.57 | 61.2 | 52.23 | 18.22 |
| 1 | 0.75 | 0.57 | 54.87 | 52.76 | 16.5 |
| 1 | 0.5 | 0.57 | 48.82 | 53.18 | 14.8 |
| 1 | 0.25 | 0.56 | 43.6 | 55.61 | 13.58 |
| 1 | 0 | 0.56 | 39.01 | 60.14 | 13.23 |
| 0.75 | 1 | 0.54 | 50.12 | 54.19 | 14.67 |
| 0.75 | 0.75 | 0.54 | 42.87 | 55.41 | 12.83 |
| 0.75 | 0.5 | 0.53 | 39.12 | 56.73 | 11.76 |
| 0.75 | 0.25 | 0.52 | 35.66 | 57.76 | 10.71 |
| 0.75 | 0 | 0.52 | 31.85 | 59.32 | 9.82 |
| 0.5 | 1 | 0.48 | 41.67 | 53.55 | 10.71 |
| 0.5 | 0.75 | 0.48 | 36.13 | 54.97 | 9.53 |
| 0.5 | 0.5 | 0.47 | 31.81 | 55.21 | 8.25 |
| 0.5 | 0.25 | 0.47 | 28.86 | 56.49 | 7.66 |
| 0.5 | 0 | 0.46 | 24.81 | 58.77 | 6.71 |
| 0.25 | 1 | 0.47 | 32.08 | 56.34 | 8.49 |
| 0.25 | 0.75 | 0.47 | 28.83 | 57.69 | 7.82 |
| 0.25 | 0.5 | 0.46 | 25.01 | 58.82 | 6.77 |
| 0.25 | 0.25 | 0.44 | 19.32 | 60.13 | 5.11 |
| 0.25 | 0 | 0.43 | 11.76 | 60.87 | 3.08 |
| 0 | 1 | 0.53 | 25.73 | 59.25 | 8.08 |
| 0 | 0.75 | 0.47 | 18.01 | 59.45 | 5.03 |
| 0 | 0.5 | 0.44 | 12.5 | 59.68 | 3.28 |
| 0 | 0.25 | 0.41 | 6.2 | 60.56 | 1.54 |

In conclusion, SiBF PEC cells with ultrahigh $J_H$ of 61.2 mA/cm$^2$ and SHCE of 18.22% exhibited excellent hydrogen production rates. Due to the extraordinary bifacial cell design, light harvesting, catalytic reaction, and chemical protection were balanced efficiently to optimize the overall performance. By tuning the thickness of Pt catalyst appropriately, the roughness of the catalytic layer was effectively controlled and the device was operated up to 370 hr, showing excellent chemical stability. Angular dependent and light-intensity dependent characterizations were performed to demonstrate the significant bifacial light harvesting properties with all-angle hydrogen production functionality. The high efficiency, stable, and controllable scheme demonstrated here provides possibilities for achieving the next-generation of renewable energy technology.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto Various examples have been described. These and other examples are within the scope of the following claims.

What is claimed is:

1. A photoelectrochemical (PEC) cell, comprising:
    a semiconductor photoelectrode configured with at least two light-harvesting faces for 360° light absorption, wherein the semiconductor photoelectrode includes a n-type semiconductor between a n$^+$-type semiconductor and a p$^+$-type semiconductor, and wherein micropyramid arrays are fabricated on the surfaces of the n$^+$-type semiconductor and the p$^+$-type semiconductor;
    a catalyst layer deposited on at least one light-harvesting face and in contact with an electrolyte, wherein the catalyst layer is deposited directly onto the micropyramid array fabricated on the surface of the n$^+$-type semiconductor;
    a finger-patterned electrode layer deposited on at least another light-harvesting face; and
    a counter electrode in contact with the electrolyte.

2. The PEC cell of claim 1, wherein the semiconductor photoelectrode includes one or more of silicon, germanium, and gallium arsenide.

3. The PEC cell of claim 1, wherein the catalyst layer is a protective layer and a catalyst layer.

4. The PEC cell of claim 1, wherein the catalyst layer includes one or more of Pt, Ni, $TiO_2$, and $NiO_x$ (where x is equal to or greater than 1), Pt, Ru, Pd, Rh, Fe, and $SrTiO_3$.

5. The PEC cell of claim 1, wherein a thickness of a catalyst layer ranges from about 3 nm to about 15 nm.

6. The PEC cell of claim 1, wherein a conductivity of the semiconductor photoelectrode increases as a thickness of the catalyst layer increases.

7. The PEC cell of claim 1, wherein the counter electrode includes platinum.

8. The PEC cell of claim 1, further comprising a $Si_3N_4$ antireflection layer.

9. The PEC cell of claim 8, wherein the $Si_3N_4$ antireflection layer is about 70 nm thick.

10. The PEC cell of claim 1, wherein the efficiency of the PEC cell is at least about 18% in one or more of an acidic electrolyte, neutral electrolyte, and basic electrolyte.

11. The PEC cell of claim 1, wherein a lifetime of the PEC cell is about 370 hours.

12. The PEC cell of claim 1, wherein the p$^+$-type semiconductor is about 300 nm thick and comprises a thermally-diffused dopant.

13. The PEC cell of claim 12, wherein the thermally-diffused dopant is B.

14. The PEC cell of claim 1, wherein the n$^+$-type semiconductor is about 300 nm thick and comprises a thermally-diffused dopant.

15. The PEC cell of claim 14, wherein the thermally-diffused dopant is P.

16. The PEC cell of claim 1, further comprising an $Al_2O_3$ layer with a thickness of about 7 nm.

17. A water-splitting device comprising the PEC cell of claim 1.

* * * * *